US 11,205,386 B2

(12) United States Patent
Kim et al.

(10) Patent No.: US 11,205,386 B2
(45) Date of Patent: *Dec. 21, 2021

(54) DISPLAY DEVICE

(71) Applicant: SAMSUNG DISPLAY CO., LTD., Yongin-si (KR)

(72) Inventors: Yang Wan Kim, Yongin-si (KR); Jae Yong Lee, Yongin-si (KR); Sun Ja Kwon, Yongin-si (KR); Hyun Ae Park, Yongin-si (KR); Byung Sun Kim, Yongin-si (KR); Su Jin Lee, Yongin-si (KR); Hyung Jun Park, Yongin-si (KR); Yu Jin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/708,396

(22) Filed: Dec. 9, 2019

(65) Prior Publication Data
US 2020/0118496 A1 Apr. 16, 2020

Related U.S. Application Data

(63) Continuation of application No. 15/611,297, filed on Jun. 1, 2017, now Pat. No. 10,504,446.

(30) Foreign Application Priority Data

Jun. 30, 2016 (KR) .................. 10-2016-0083128

(51) Int. Cl.
G09G 3/30 (2006.01)
G09G 3/3266 (2016.01)
(Continued)

(52) U.S. Cl.
CPC ......... G09G 3/3266 (2013.01); G09G 3/3233 (2013.01); G09G 3/3258 (2013.01);
(Continued)

(58) Field of Classification Search
CPC .. G09G 3/3266; G09G 3/3233; G09G 3/3258; G09G 2320/0223;
(Continued)

(56) References Cited

U.S. PATENT DOCUMENTS 6,774,414 B2  8/2004  Chang
7,253,865 B2  8/2007  Battersby
(Continued)

FOREIGN PATENT DOCUMENTS

CN    1628263 A    6/2005
CN    1656530 A    8/2005
(Continued)

OTHER PUBLICATIONS

EPO Partial Search Report dated Oct. 25, 2017, for corresponding European Patent Application No. 17178307.9 (31 pages).
(Continued)

Primary Examiner — Adam R. Giesy
(74) Attorney, Agent, or Firm — Lewis Roca Rothgerber Christie LLP

(57) ABSTRACT

A display device includes a substrate having a first pixel region, a second pixel region having a smaller area than the first pixel region, the second pixel region being connected to the first pixel region, and a peripheral region surrounding the first pixel region and the second pixel region, a first pixel and a second pixel respectively at the first and second pixel regions, a first line connected to the first pixel and a second line connected to the second pixel, and a dummy unit in the peripheral region, the dummy unit overlapping with at least one of the first and second lines, the dummy unit being
(Continued)

configured to compensate for a difference between a load value of the first line and a load value of the second line, wherein the dummy unit includes at least two sub-dummy units spaced from each other.

20 Claims, 28 Drawing Sheets

(51) Int. Cl.
    *G09G 3/3233* (2016.01)
    *G09G 3/3258* (2016.01)
    *H01L 27/32* (2006.01)
(52) U.S. Cl.
    CPC ...... *H01L 27/3216* (2013.01); *H01L 27/3223* (2013.01); *H01L 27/3276* (2013.01); *G09G 2300/0413* (2013.01); *G09G 2300/0426* (2013.01); *G09G 2300/0861* (2013.01); *G09G 2310/0251* (2013.01); *G09G 2310/0262* (2013.01); *G09G 2310/08* (2013.01); *G09G 2320/0223* (2013.01); *G09G 2320/0233* (2013.01); *H01L 27/3246* (2013.01)
(58) Field of Classification Search
    CPC ... G09G 2300/0426; G09G 2300/0861; G09G 2310/0262; G09G 2310/0251; G09G 2300/0413; G09G 2310/08; G09G 2320/0233; H01L 27/3216; H01L 27/3233; H01L 27/3276; H01L 27/3246
    See application file for complete search history.

(56) References Cited

U.S. PATENT DOCUMENTS

| | | | |
|---|---|---|---|
| 7,579,624 B2 | 8/2009 | Takasugi et al. |
| 7,911,423 B2 | 3/2011 | Kim et al. |
| 8,089,596 B2 | 1/2012 | Koma et al. |
| 8,325,116 B2 | 12/2012 | Takasugi et al. |
| 8,350,972 B2 | 1/2013 | Taneda et al. |
| 8,477,250 B2 | 7/2013 | Schellingerhout et al. |
| 8,665,249 B2 | 3/2014 | Suh |
| 8,736,525 B2 | 5/2014 | Kawabe |
| 9,305,508 B2 | 4/2016 | Park et al. |
| 9,716,132 B2 | 7/2017 | Kinoshita |
| 9,837,022 B2 | 12/2017 | Lee et al. |
| 10,115,780 B2 | 10/2018 | Kim et al. |
| 10,229,964 B2 | 3/2019 | Kim et al. |
| 10,354,578 B2 | 7/2019 | Ka et al. |
| 10,403,193 B2 | 9/2019 | Kim et al. |
| 10,418,597 B2 | 9/2019 | Li et al. |
| 10,467,958 B2 | 11/2019 | Kim et al. |
| 10,490,119 B2 | 11/2019 | Kim et al. |
| 10,490,122 B2 | 11/2019 | Kim et al. |
| 10,504,446 B2 | 12/2019 | Kim et al. |
| 10,516,016 B2 | 12/2019 | Kim et al. |
| 10,636,859 B2 | 4/2020 | Park et al. |
| 10,748,472 B2 | 8/2020 | Kim et al. |
| 2003/0030630 A1 | 2/2003 | Bayot et al. |
| 2004/0012744 A1 | 1/2004 | Ishige et al. |
| 2004/0125258 A1 | 7/2004 | Moon et al. |
| 2005/0243259 A1 | 11/2005 | Song et al. |
| 2006/0244387 A1 | 11/2006 | Park et al. |
| 2006/0290618 A1 | 12/2006 | Goto |
| 2007/0080433 A1 | 4/2007 | Lai |
| 2008/0088568 A1 | 4/2008 | Haga et al. |
| 2008/0218450 A1 | 9/2008 | Park |
| 2009/0102758 A1 | 4/2009 | Anzai et al. |
| 2009/0102824 A1 | 4/2009 | Tanaka et al. |
| 2009/0295843 A1 | 12/2009 | Dunn |
| 2009/0303260 A1 | 12/2009 | Takasugi |
| 2009/0303404 A1 | 12/2009 | Kretz |
| 2010/0020059 A1 | 1/2010 | Suh |
| 2010/0039604 A1 | 2/2010 | Kim |
| 2010/0073335 A1 | 3/2010 | Min et al. |
| 2010/0177024 A1 | 7/2010 | Choi |
| 2010/0187533 A1 | 7/2010 | Chang |
| 2011/0084955 A1 | 4/2011 | Kim |
| 2012/0112988 A1 | 5/2012 | Nakanishi et al. |
| 2013/0106817 A1 | 5/2013 | Gang et al. |
| 2015/0022513 A1 | 1/2015 | Kim |
| 2015/0069348 A1 | 3/2015 | Tae |
| 2015/0325593 A1 | 11/2015 | Shih et al. |
| 2015/0331290 A1 | 11/2015 | Jung et al. |
| 2015/0379930 A1 | 12/2015 | Lee et al. |
| 2016/0012768 A1 | 1/2016 | In et al. |
| 2016/0019856 A1 | 1/2016 | Tanaka et al. |
| 2016/0027380 A1 | 1/2016 | Kim et al. |
| 2016/0035811 A1 | 2/2016 | Choi et al. |
| 2016/0086977 A1 | 3/2016 | Go et al. |
| 2016/0111040 A1 | 4/2016 | Kim et al. |
| 2016/0190166 A1 | 6/2016 | Kim et al. |
| 2016/0240141 A1 | 8/2016 | Lee et al. |
| 2016/0321992 A1 | 11/2016 | Kim et al. |
| 2017/0249896 A1 | 8/2017 | Kim et al. |
| 2017/0301280 A1 | 10/2017 | Ka et al. |
| 2018/0005585 A1 | 1/2018 | Kim et al. |
| 2018/0075804 A1 | 3/2018 | Kim et al. |
| 2018/0082630 A1 | 3/2018 | Kim et al. |
| 2018/0090061 A1 | 3/2018 | Kim et al. |
| 2018/0151660 A1 | 5/2018 | Kim et al. |
| 2018/0151663 A1 | 5/2018 | Kim et al. |
| 2018/0240856 A1 | 8/2018 | Kim et al. |
| 2019/0035876 A1 | 1/2019 | Kim et al. |
| 2020/0098310 A1 | 3/2020 | Kim et al. |

FOREIGN PATENT DOCUMENTS

| | | |
|---|---|---|
| CN | 1836269 A | 9/2006 |
| CN | 101401143 A | 4/2009 |
| CN | 101443695 A | 5/2009 |
| CN | 101561992 A | 10/2009 |
| CN | 101578649 A | 11/2009 |
| CN | 101313349 A | 12/2010 |
| CN | 102396020 A | 3/2012 |
| CN | 102789755 A | 11/2012 |
| CN | 202583659 U | 12/2012 |
| CN | 103579221 A | 2/2014 |
| CN | 104077998 A | 10/2014 |
| CN | 105204248 A | 12/2015 |
| CN | 106711180 A | 5/2017 |
| EP | 1063630 A2 | 12/2000 |
| EP | 2085952 A1 | 8/2009 |
| EP | 3232431 A1 | 10/2017 |
| EP | 3264405 A2 | 1/2018 |
| JP | 2007-232981 A | 9/2007 |
| KR | 10-0672792 | 1/2007 |
| KR | 10-2008-0060886 | 7/2008 |
| KR | 10-2009-0005651 A | 1/2009 |
| KR | 10-1054327 B1 | 8/2011 |
| KR | 10-1064425 | 9/2011 |
| KR | 10-1101070 | 12/2011 |
| KR | 10-1376654 | 3/2014 |
| KR | 10-1416529 | 7/2014 |
| KR | 10-1432126 | 8/2014 |
| KR | 10-2016-0099770 A | 8/2016 |
| KR | 10-2017-0102147 A | 9/2017 |
| KR | 10-2017-0119270 A | 10/2017 |
| KR | 10-2018-0003747 | 1/2018 |
| KR | 10-2018-0029133 A | 3/2018 |
| KR | 10-2018-0033373 A | 4/2018 |
| KR | 10-2018-0061565 | 6/2018 |
| TW | 201109786 A1 | 3/2011 |
| WO | WO 2007/069187 A2 | 6/2007 |

OTHER PUBLICATIONS

EPO Extended Search Report dated Mar. 14, 2018, for corresponding European Patent Application No. 17178307.9 (32 pages).
EPO Office action dated Jun. 3, 2019, corresponding to European Patent Application No. 17166354.5 (10 pages).

(56) References Cited

OTHER PUBLICATIONS

U.S. Office Action dated May 17, 2018, issued in U.S. Appl. No. 15/398,391 (16 pages).
U.S. Office Action dated May 17, 2018, issued in U.S. Appl. No. 15/434,196 (15 pages).
U.S. Office Action dated Jan. 11, 2019, issued in U.S. Appl. No. 15/712,657 (25 pages).
European Result of consultation on Jul. 13, 2020 issued in European Patent Application No. 17166354.5, which is corresponding to U.S. Pat. No. 10,354,578.
Uchida, Yoshihiro et al., "Parasitic Capacitance Modeling for TFT Liquid Crystal Displays," 33rd Conference on European Solid-State Device Research, Oct. 2004, 4 pages.
Zhou, Lei et al., "Design Analysis of Large Size Metal Oxide TFT Panel," Chinese Journal of Luminescence, vol. 36, No. 5, May 2015, 6 pages.
Chinese Office Action dated Oct. 9, 2020, issued in Chinese Patent Application No. 201710515778.X (11 pages).
EPO Extended Search Report dated Jun. 27, 2018, corresponding to European Patent Application No. 18157710.7 (7 pages).
U.S. Office Action dated Apr. 1, 2020, issued in U.S. Appl. No. 16/805,635 (18 pages).
U.S. Office Action dated Sep. 11, 2020, issued in U.S. Appl. No. 16/723,970 (10 pages).
U.S. Office Action dated Oct. 1, 2020, issued in U.S. Appl. No. 16/859,917 (11 pages).
U.S. Notice of Allowance dated Apr. 14, 2021, issued in U.S. Appl. No. 16/298,924 (13 pages).
U.S. Notice of Allowance dated Mar. 9, 2021, issued in U.S. Appl. No. 16/805,635 (10 pages).
U.S. Office Action dated May 13, 2021, issued in U.S. Appl. No. 16/995,615 (30 pages).
EPO Extended European Search Report dated Jun. 14, 2021, issued in European Patent Application No. 21164738.3 (12 pages).

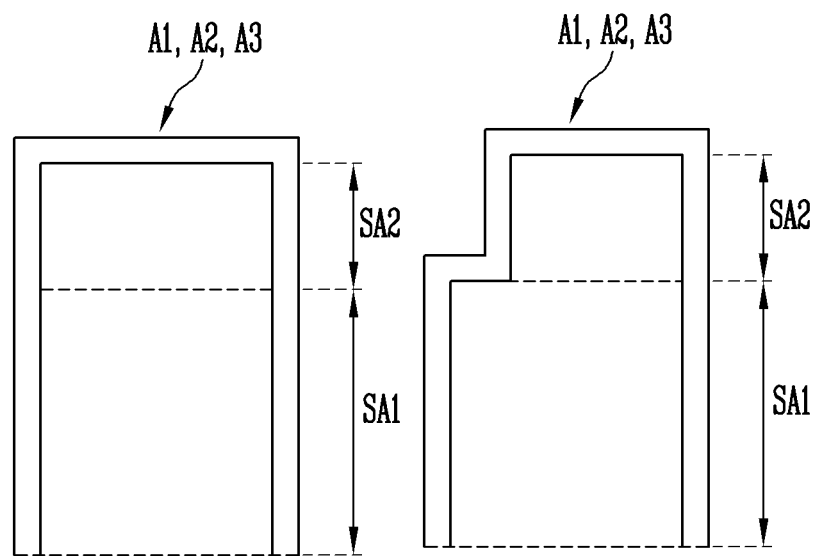
FIG. 4
FIG. 6
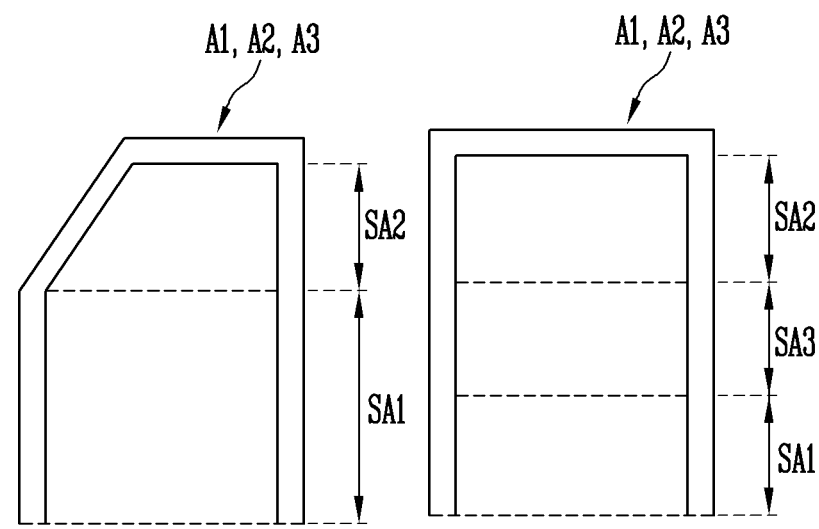
FIG. 5
FIG. 7

DISPLAY DEVICE

CROSS-REFERENCE TO RELATED APPLICATION

This application is a continuation of U.S. patent application Ser. No. 15/611,297, filed Jun. 1, 2017, which claims priority to and the benefit of Korean Patent Application No. 10-2016-0083128, filed Jun. 30, 2016, the entire content of both of which is incorporated herein by reference.

BACKGROUND

1. Field

An aspect of the present disclosure relates to a display device, and more particularly, to a display device including regions having different areas.

2. Description of the Related Art

A display device includes a plurality of pixels including a display element. Lines and a plurality of transistors connected to the lines to drive the display element are provided in each pixel. The lines may have different load values depending on lengths of the lines. A luminance difference caused by a difference between the load values may occur in a final image provided from the display device.

SUMMARY

Aspects of embodiments of the present disclosure are directed to a display device having uniform luminance regardless of regions.

According to some embodiments of the present disclosure, there is provided a display device including: a substrate having a first pixel region, a second pixel region having a smaller area than the first pixel region, the second pixel region being connected to the first pixel region, and a peripheral region surrounding the first pixel region and the second pixel region; a first pixel and a second pixel respectively at the first and second pixel regions; a first line connected to the first pixel and a second line connected to the second pixel; and a dummy unit in the peripheral region, the dummy unit overlapping with at least one of the first and second lines, the dummy unit being configured to compensate for a difference between a load value of the first line and a load value of the second line, wherein the dummy unit includes at least two sub-dummy units spaced from each other.

In some embodiments, the peripheral region has: a first peripheral region around the first pixel region; a second peripheral region around the second pixel region; and an additional peripheral region adjacent to the first pixel region and the second peripheral region.

In some embodiments, a length of the first line is greater than that of the second line.

In some embodiments, the first line is a first scan line for providing a scan signal to the first pixel, and the second line is a second scan line for providing a scan signal to the second pixel.

In some embodiments, the dummy unit includes: a first sub-dummy unit in the second peripheral region; and a second sub-dummy unit in the additional peripheral region.

In some embodiments, the dummy unit includes a dummy line provided to the second peripheral region and the additional peripheral region, the dummy line overlapping with the second scan line.

In some embodiments, the second pixel region has: a first sub-region adjacent to the first pixel region; and a second sub-region spaced from the first pixel region.

In some embodiments, a portion of the dummy line of the first sub-dummy unit overlaps with the second scan line connected to the second pixel of the first sub-region, and a portion of the dummy line of the second sub-dummy unit overlaps with the second scan line connected to the second pixel of the second sub-region.

In some embodiments, the second sub-region has the same width as the first sub-region.

In some embodiments, a load value compensated by the first sub-dummy unit is equal to that compensated by the second sub-dummy unit.

In some embodiments, a width of the second sub-region decreases as a distance from the first sub-region increases.

In some embodiments, the load value compensated by the first sub-dummy unit is different from that compensated by the second sub-dummy unit.

In some embodiments, the load value compensated by the first sub-dummy unit is smaller than that compensated by the second sub-dummy unit.

In some embodiments, the display device further includes first and second light emitting control lines respectively connected to the first and second pixels.

In some embodiments, a portion of the dummy line of the first sub-dummy unit overlaps with the second light emitting control line connected to the second pixel in a first sub-region of the second pixel region, and a portion of the dummy line of the second sub-dummy unit overlaps with the second light emitting control line connected to the second pixel in a second sub-region of the second pixel region.

In some embodiments, the substrate further has a third pixel region spaced from the second pixel region, the third pixel region being connected to the first pixel region.

In some embodiments, the display device further includes: a third pixel at the third pixel region; and a third scan line providing a scan signal to the third pixel, wherein a length of the third scan line is less than that of the first scan line.

In some embodiments, the display device further includes an additional dummy unit overlapping with the third scan line, the additional dummy unit being configured to compensate for a difference between a load value of the third scan line and a load value of the first scan line.

In some embodiments, the second pixel region has: a first sub-region adjacent to the first pixel region; a second sub-region spaced from the first pixel region; and a third sub-region between the first sub-region and the second sub-region.

In some embodiments, the dummy unit includes: a first sub-dummy unit in the additional peripheral region, the first sub-dummy unit being configured to compensate for a load value of the second line of the first sub-region; a second sub-dummy unit in the second peripheral region corresponding to the second sub-region, the second sub-dummy unit being configured to compensate for a load value of the second line of the second sub-region; and a third sub-dummy unit in the second peripheral region corresponding to the third sub-region, the third sub-dummy unit being configured to compensate for a load value of the second line of the third sub-region.

In some embodiments, the first sub-region, the second sub-region, and the third sub-region have the same width.

In some embodiments, wherein the load value compensated by the first sub-dummy unit, the load value compensated by the second sub-dummy unit, and the load value compensated by the third sub-dummy unit are the same.

In some embodiments, among the first to third sub-regions, a width of the first sub-region is greatest and a width of the second sub-region is smallest.

In some embodiments, among the load value compensated by the first sub-dummy unit, the load value compensated by the second sub-dummy unit, and the load value compensated by the third sub-dummy unit, the load value compensated by the third sub-dummy unit is greatest and the load value compensated by the first sub-dummy unit is smallest.

According to some embodiments of the present disclosure, there is provided a display device including: a substrate having a first pixel region, a second pixel region, a third pixel region, and a peripheral region surrounding the first to third pixel regions, each of the second and third pixel regions having a smaller area than the first pixel region, the second and third pixel regions being connected to the first pixel region, the second and third pixel regions being spaced from each other; a first pixel, a second pixel, and a third pixel respectively at the first to third pixel regions; a first scan line, a second scan line, and a third scan line connected to the first to third pixels to provide a scan signal to each of the first and third pixels; and dummy units in the peripheral region, the dummy units respectively overlapping with the second and third scan lines, the dummy units being configured to compensate for a difference between a load value of the first scan line and a load value of the second scan line and a difference between the load value of the first scan line and a load value of the third scan line, wherein the dummy units include at least two sub-dummy units spaced from each other.

In some embodiments, the peripheral region has: a first peripheral region around the first pixel region; a second peripheral region around the second pixel region; a third peripheral region around the third pixel region; and an additional peripheral region connecting the second peripheral region to the third peripheral region in one side of the first pixel region.

In some embodiments, the first scan line has a longer length than the second scan line and the third scan line.

In some embodiments, a dummy unit of the dummy units overlapping with the second scan line includes a first sub-dummy unit in the second peripheral region and a second sub-dummy unit in the additional peripheral region, and a dummy unit of the dummy units overlapping with the third scan line includes a third sub-dummy unit in the third peripheral region and a fourth sub-dummy unit in the additional peripheral region.

In some embodiments, the dummy units include a dummy line provided to the second peripheral region, the third peripheral region, and the additional peripheral region, the dummy line overlapping with the second scan line and the third scan line.

In some embodiments, each of the second and third pixel regions has: a first sub-region adjacent to the first pixel region; and a second sub-region spaced from the first pixel region.

In some embodiments, a portion of the dummy line of the first and third sub-dummy units overlaps with the second and third scan lines respectively connected to the second and third pixels of the first sub-region, and a portion of the dummy line of the second and fourth sub-dummy units overlaps with the second and third scan lines respectively connected to the second and third pixels of the second sub-region.

In some embodiments, the first sub-region and the second sub-region have the same width.

In some embodiments, load values compensated by the first to fourth sub-dummy units are the same.

In some embodiments, a width of the second sub-region decreases as a distance from the first sub-region increases.

In some embodiments, the load values compensated by the first and third sub-dummy units are different from those compensated by the second and fourth sub-dummy units.

In some embodiments, the load values compensated by the first and third sub-dummy units are smaller than those compensated by the second and fourth sub-dummy units.

In some embodiments, the display device further includes a first light emitting control line, a second light emitting control line, and a third light emitting control line respectively connected to the first to third pixels.

In some embodiments, the dummy line of the first and third sub-dummy units overlaps with the second and third light emitting control lines respectively connected to the second and third pixels in a first sub-region of the second and third pixel regions, and the dummy line of the second and fourth sub-dummy units overlaps with the second and third light emitting control lines respectively connected to the second and third pixels in a second sub-region of the second and third pixel regions.

In some embodiments, each of the second and third pixel regions has: a first sub-region adjacent to the first pixel region; a second sub-region spaced from the first pixel region; and a third sub-region between the first sub-region and the second sub-region.

In some embodiments, the dummy unit includes: a first sub-dummy unit in the additional peripheral region, the first sub-dummy unit being configured to compensate for a load value of the second scan line of the first sub-region; a second sub-dummy unit in the second peripheral region corresponding to the second sub-region, the second sub-dummy unit being configured to compensate for a load value of the second scan line of the second sub-region; and a third sub-dummy unit in the second peripheral region corresponding to the third sub-region, the third sub-dummy unit being configured to compensate for a load value of the second scan line of the third sub-region.

In some embodiments, the first sub-region, the second sub-region, and the third sub-region have the same width, and the load value compensated by the first sub-dummy unit, the load value compensated by the second sub-dummy unit, and the load value compensated by the third sub-dummy unit are the same.

In some embodiments, among the first to third sub-regions, a width of the first sub-region is greatest and a width of the second sub-region is smallest, and, among the load value compensated by the first sub-dummy unit, the load value compensated by the second sub-dummy unit, and the load value compensated by the third sub-dummy unit, the load value compensated by the third sub-dummy unit is greatest and the load value compensated by the first sub-dummy unit is smallest.

According to some embodiments of the present disclosure, there is provided a display device including: a substrate having a first pixel region, a second pixel region, a third pixel region, and a peripheral region surrounding the first, second, and third pixel regions, the second and third pixel regions being adjacent to a same side of the first pixel region and each having a smaller area than the first pixel region; a first pixel, a second pixel, and a third pixel respectively at the first, second, and third pixel regions; a first scan line, a second scan line, and a third scan line for providing scan signals to the first, second, and third pixels, respectively; and a dummy unit including a first sub-dummy unit, a second sub-dummy unit, and a third sub-dummy unit, the first to third sub-dummy units being spaced from one another at the peripheral region, the first to third sub-dummy units overlapping the first to third scan lines to form parasitic capacitors with the first to third scan lines, the parasitic capacitors being configured to compensate for a difference between a load value of the first line and load values of the second and third scan lines.

In some embodiments, not all overlap regions between the first to third sub-dummy units and the first to third scan lines are the same, such that the parasitic capacitors do not all have the same capacitance.

In some embodiments, first sub-dummy unit is at a portion of the peripheral region corresponding to a gap between the first and second pixel regions where no pixels exist.

In some embodiments, the second sub-dummy unit is at a side of the second pixel region opposite to the first pixel region.

In some embodiments, the third sub-dummy unit and a scan driver are at opposite sides of the second pixel region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. Like reference numerals refer to like elements throughout.

FIGS. 4-9 are conceptual views illustrating shapes of regions of the display devices.

DETAILED DESCRIPTION

The present disclosure is described more fully hereinafter with reference to the accompanying drawings, in which exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the present disclosure to those skilled in the art.

Hereinafter, exemplary embodiments of the present disclosure will be described in detail with reference to the accompanying drawings.

Figure 1:
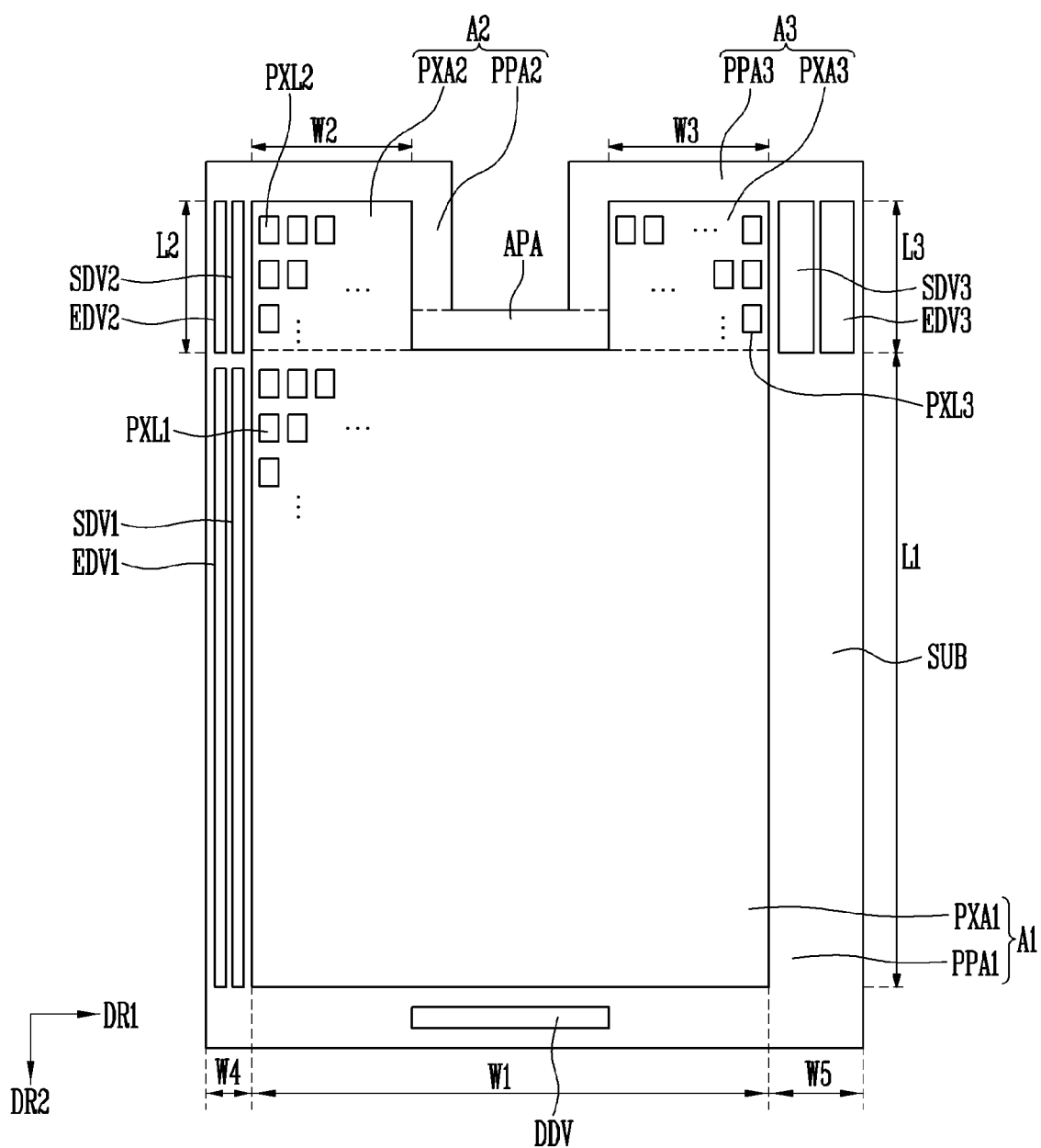
FIGS. 1-3 are plan views illustrating display devices according to embodiments of the present disclosure.
Figure 2:
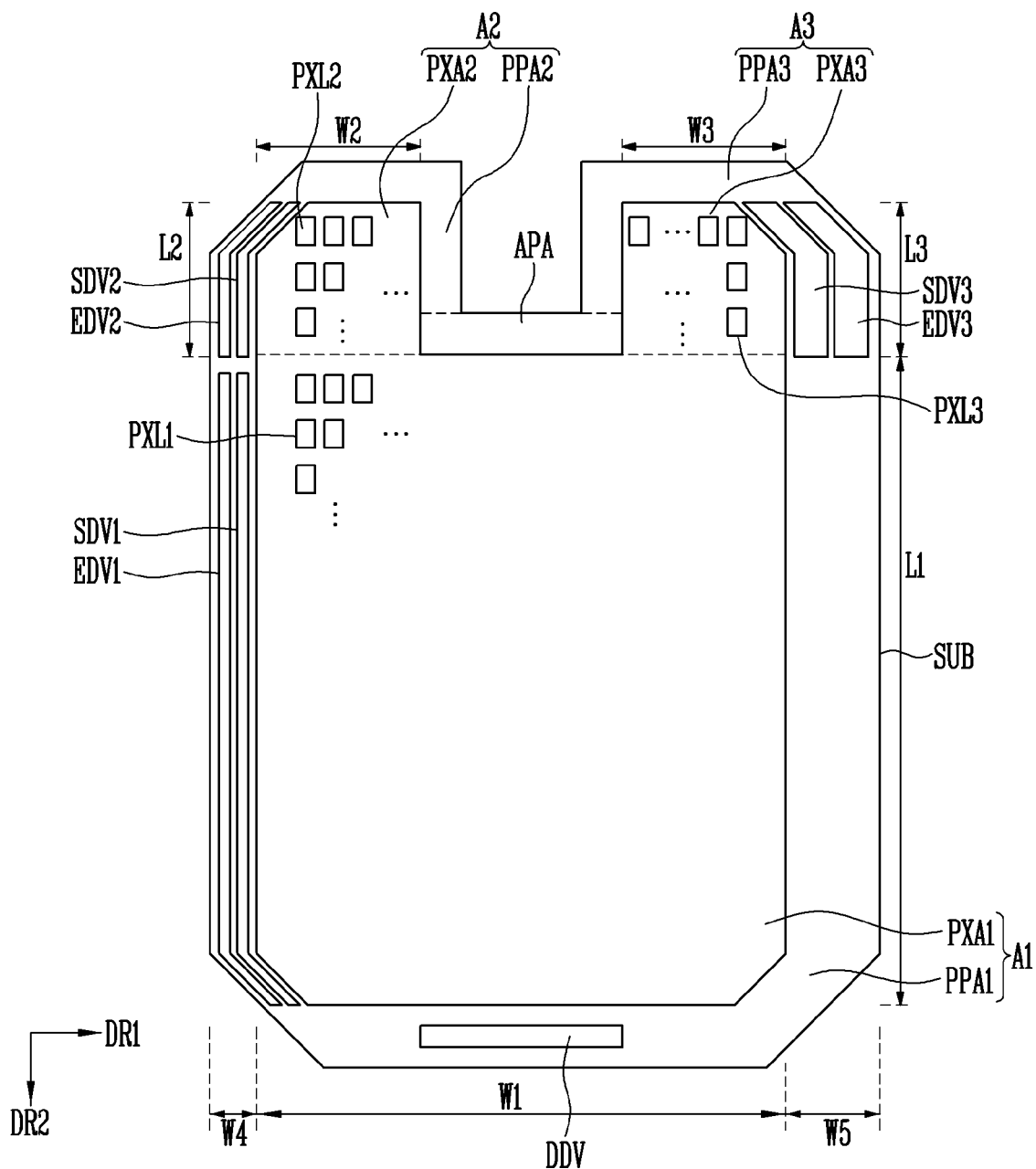
Figure 3:
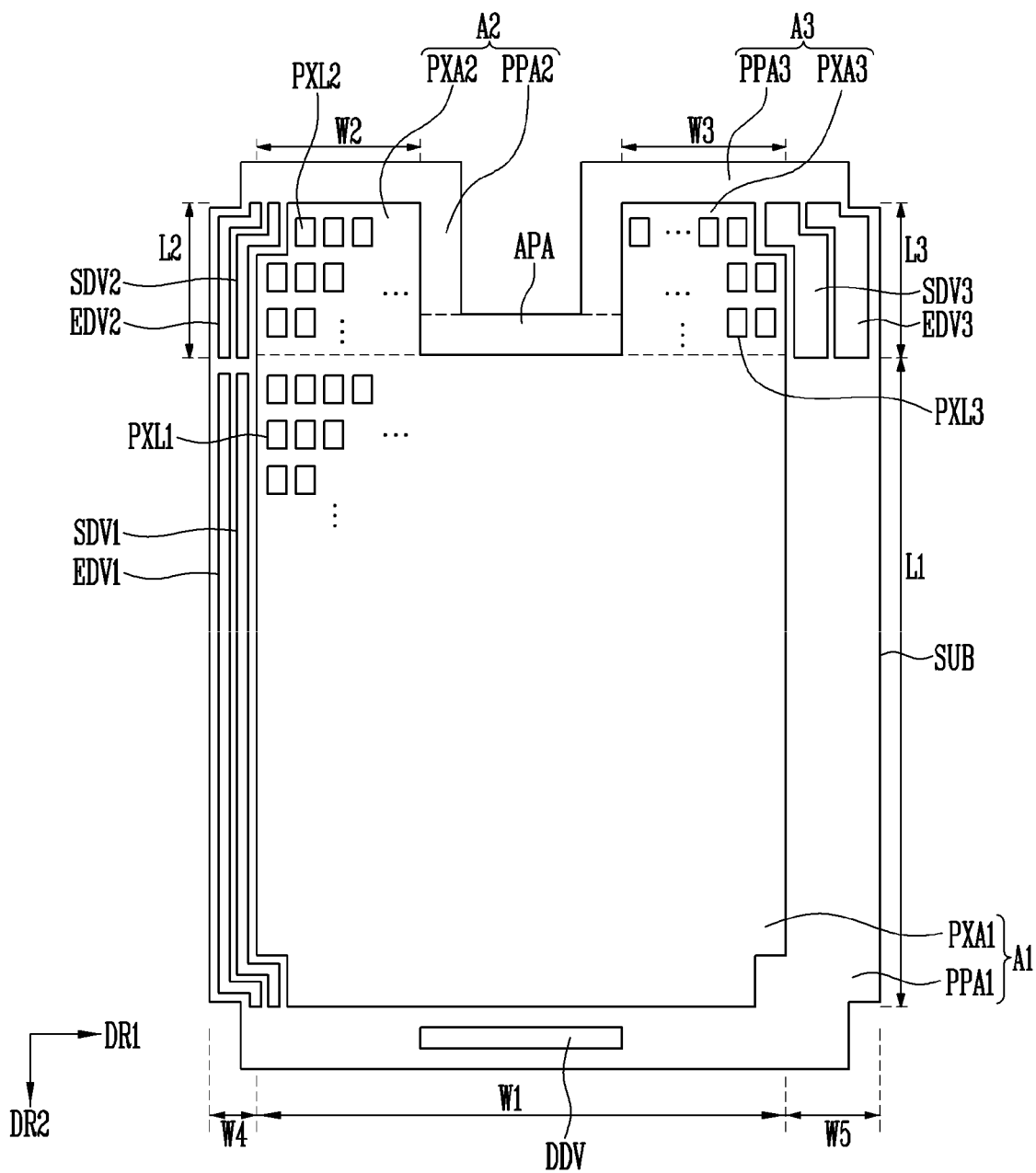

FIGS. 1 to 3 are plan views illustrating display devices according to embodiments of the present disclosure. FIGS. 4 to 9 are conceptual views illustrating shapes of regions of the display devices.

Referring to FIGS. 1 to 9, each of the display devices according to the embodiments may include a substrate SUB, pixels PXL1, PXL2, and PXL3 (hereinafter, referred to as PXL), a drive unit (e.g., a driver) provided on the substrate SUB, the drive unit being for driving the pixels PXL, a power supply unit (e.g., a power supply) for supplying power to the pixels PXL, and a line unit (e.g., a plurality conductive lines) for connecting the pixels PXL to the drive unit.

The substrate SUB includes a plurality of regions, and at least two among the regions may have areas that are different from each other. As an example, the substrate SUB may have two regions, and the two regions may have areas that are different from each other. Also, as an example, the substrate SUB may have three regions. In this case, all of the three regions may have areas that are different from one another, or only two regions among the three regions may have areas that are different from each other. In an embodiment, the substrate SUB may have four or more regions.

In the following embodiments, for convenience of description, a case where the substrate SUB includes three regions, that is, first, second, third regions A1, A2, and A3 is illustrated as an example.

The first to third regions A1, A2, and A3 may be driven concurrently (e.g., simultaneously) or independently.

The first to third regions A1, A2, and A3 may have various suitable shapes. For example, the first to third regions A1, A2, and A3 may be provided in various shapes, such as a closed-shape polygon including a polygon having straight lines, a polygon having curved sides, a polygon having both straight and curved sides, or another closed curve, such as a circle, an ellipse, a semicircle, a semi-ellipse, and/or the like.

The first to third regions A1, A2, and A3 may include pixel regions PXA1, PXA2, and PXA3 (hereinafter, referred to as PXA) and peripheral regions PPA1, PPA2, and PPA3 (hereinafter, referred to as PPA). The pixel regions PXA are regions in which pixels PXL for displaying images are located. Each pixel PXL will be described later.

Each of the pixel regions PXA1, PXA2, and PXA3 may include at least two sub-regions, such as SA1, SA2, and SA3.

As shown in FIGS. 4 to 6, each of the pixel regions PXA1, PXA2, and PXA3 may include a first sub-region SA1 and a second sub-region SA2. In the first direction DR1, the width of the first sub-region SA1 may be equal to that of the second sub-region SA2. The first sub-region SA1 may be a region that is adjacent to an adjacent pixel region among the pixel regions PXA1, PXA2, and PXA3. The second sub-region SA2 may be a region that is spaced apart from the adjacent pixel region.

As shown in FIG. 4, the width of the first sub-region SA1 may be equal to that of the second sub-region SA2. Alternatively, as shown in FIG. 5, the width of the second sub-region SA2 may be decreased as it becomes distant from the first sub-region SA1 (e.g., as the distance from the first sub-region SA1 increases). Alternatively, as shown in FIG. 6, the width of the first sub-region SA1 may be slightly greater than that of the second sub-region SA2. Here, the width of the second sub-region SA2 may be uniform regardless of its distance from the first sub-region SA1.

Figure 8:
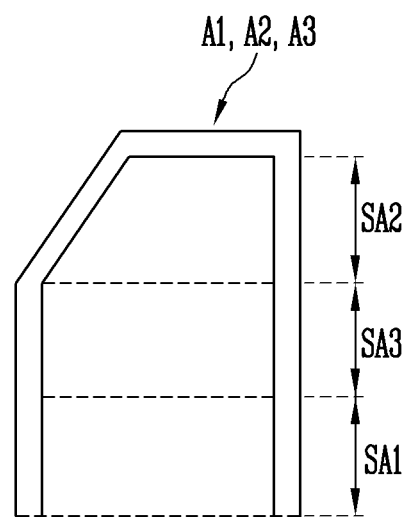
Figure 9:
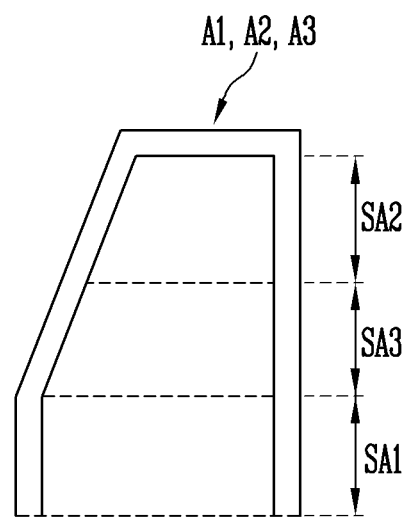

In addition, as shown in FIGS. 7 to 9, each of the pixel regions PXA1, PXA2, and PXA3 may include a first sub-region SA1, a second sub-region SA2, and a third sub-region SA3. The first sub-region SA1 may be a region that is adjacent to an adjacent pixel region among the pixel regions PXA1, PXA2, and PXA3. The second sub-region SA2 may be a region that is spaced apart from the adjacent pixel region. The third sub-region SA3 may be a region between the first sub-region SA1 and the second sub-region SA2.

As shown in FIG. 7, the widths of the first sub-region SA1, the second sub-region SA2, and the third sub-region SA3 may be equal to one another. As shown in FIG. 8, the width of the first sub-region SA1 may be equal to that of the third sub-region SA3, and may be greater than that of the second sub-region SA2. Here, the width of the second sub-region SA2 may be decreased as it becomes distant from the first sub-region SA1. As shown in FIG. 9, the width of the third sub-region SA3 may be decreased as it becomes distant from the first sub-region SA1, and the width of the second sub-region SA2 may be decreased as it becomes distant from the third sub-region SA3 (e.g., as the distance from the third sub-region SA3 increases).

In an embodiment, the first to third pixel regions PXA1, PXA2, and PXA3 may roughly have shapes corresponding to those of the first to third regions A1, A2, and A3, respectively.

The peripheral regions PPA are regions in which the pixels PXL are not provided, and no image is displayed in the peripheral regions PPA. The drive unit for driving the pixels PXL, the power supply unit for supplying power to the pixels PXL, and a portion of lines for coupling the pixels PXL to the drive unit may be provided in the peripheral regions PPA. The peripheral regions PPA correspond to a bezel in the final display device, and the width of the bezel may be determined based on a width of the peripheral region.

A first peripheral region PPA1 may be provided at at least one side of a first pixel region PXA1. In an embodiment, the first peripheral region PPA1 surrounds the periphery of the first pixel region PXA1, but may be provided at a portion except portions at which the second region A2 and the third region A3, which will be described later, are disposed. In an embodiment, the first peripheral region PPA1 may include a lateral part extending in the first direction DR1 and a longitudinal part extending in a second direction DR2. The longitudinal part of the first peripheral region PPA1 may be provided in a pair that is spaced apart from each other along the first direction DR1 with the first pixel region PXA1 interposed therebetween.

The second region A2 may have a smaller area than the first region A1. The second region A2 may include a second pixel region PXA2 in which an image is displayed and a second peripheral region PPA2 surrounding at least one portion of the second pixel region PXA2.

The second pixel region PXA2 may be provided in a shape corresponding to that of the second region A2. In an embodiment, the second pixel region PXA2 may have a second width W2 that is smaller than a first width W1 of the first region A1. The second pixel region PXA2 may have a length L2 that is smaller than a first length L1 of the first region A1. The second pixel region PXA2 is provided in a shape protruding from the first pixel region PXA1, and may be directly connected to the first pixel region PXA1. In other words, one side of the second pixel region PXA2 may contact one side of the first pixel region PXA1.

The second peripheral region PPA2 may be provided at at least one side of the second pixel region PXA2. In an embodiment, the second peripheral region PPA2 surrounds the second pixel region PXA2, but may not be provided at a portion at which the first pixel region PXA1 and the second pixel region PXA2 are connected to each other. In an embodiment, the second peripheral region PPA2 may also include a lateral part extending in the first direction DR1 and a longitudinal part extending in the second direction DR2. The longitudinal part of the second peripheral region PPA2 may be provided in a pair that is spaced apart from each other in the first direction DR1 with the second pixel region PXA2 interposed therebetween.

The third region A3 may have a smaller area than the first region A1. For example, the third region A3 may have the same area as the second region A2. The third region A3 may include a third pixel region PXA3 in which an image is displayed and a third peripheral region PPA3 surrounding at least one portion of the third pixel region PXA3.

The third pixel region PXA3 may be provided in a shape corresponding to that of the third region A3. In an embodiment, the third pixel region PXA3 may have a third width W3 that is smaller than the first width W1 of the first region A1. The third pixel region PXA3 may have a third length L3 that is smaller than the first length L1 of the first region A1. The second width W2 and the third width W3 may be equal to each other. In addition, the second length L2 and the third length L3 may be equal to each other.

The third pixel region PXA3 is provided in a shape protruding from the first pixel region PXA1, and may be directly connected to the first pixel region PXA1. In other words, one side of the third pixel region PXA3 may contact one side of the first pixel region PXA1.

The third peripheral region PPA3 may be provided at at least one side of the third pixel region PXA3. In an embodiment, the third peripheral region PPA3 surrounds the third pixel region PXA3, but may not be provided at a portion at which the first pixel region PXA1 and the third pixel region PXA3 are connected to each other. In an embodiment, the third peripheral region PPA3 may also include a lateral part extending in the first direction DR1 and a longitudinal part extending in the second direction DR2. The longitudinal part of the third peripheral region PPA3 may be provided in a pair that is spaced apart from each other along the first direction with the first pixel region PXA1 interposed therebetween.

In an embodiment, the third region A3 may have a shape that is linearly symmetric to the second region A2 with respect to a center line of the first region A1 (which separates the second and third regions A2 and A3). In this case, the arrangement of components provided in the third region A3 may be substantially identical to that in the second region A2, except some lines (e.g., some power or signal lines).

Therefore, the substrate SUB may have a shape in which the second region A2 and the third region A3 protrude in the second direction DR2 from the first region A1. In addition, because the second region A2 and the third region A3 are disposed to be spaced apart from each other, the substrate SUB may have a shape in which it is depressed between the second region A2 and the third region A3. That is, the substrate SUB may have a notch between the second region A2 and the third region A3.

In an embodiment, the longitudinal parts of the first peripheral region PPA1 may be respectively connected to some of the longitudinal parts of the second peripheral region PPA2 and the third peripheral region PPA3. For example, a left longitudinal part of the first peripheral region PPA1 may be connected to a left longitudinal part of the second peripheral region PPA2. A right longitudinal part of the first peripheral region PPA may be connected to a right longitudinal part of the third peripheral region PPA3. In addition, the left longitudinal part of the first peripheral region PPA1 and the left longitudinal part of the second peripheral region PPA2 may have the same width W4. The right longitudinal part of the first peripheral region PPA1 and the right longitudinal part of the third peripheral region PPA3 may have the same width W5.

The width W4 of the left longitudinal parts of the first peripheral region PPA1 and the second peripheral region PPA2 may be different from the width W5 of the right longitudinal parts of the first peripheral region PPA1 and the third peripheral region PPA3. For example, the width W4 of the left longitudinal parts of the first peripheral region PPA1 and the second peripheral region PPA2 may be smaller than the width W5 of the right longitudinal parts of the first peripheral region PPA1 and the third peripheral region PPA3.

In an embodiment, the substrate SUB may further include an additional peripheral region APA. The additional peripheral region APA may be provided adjacent to the first pixel region PXA1, the second peripheral region PPA2, and the third peripheral region PPA3. For example, the additional peripheral region APA may connect the second peripheral region PPA2 to the third peripheral region PPA3. For example, the peripheral region APA may connect a right longitudinal part of the second peripheral region PPA2 to a left longitudinal part of the third peripheral region PPA3. That is, the additional peripheral region APA may be provided at a side of the first pixel region PXA1 between the second region A2 and the third region A3.

The pixels PXL may be provided in the pixel regions PXA, that is, the first to third pixel regions PXA1, PXA2, and PXA3, on the substrate SUB. Each pixel PXL is a minimum unit (e.g., may represent a granularity) for displaying an image, and a plurality of pixels PXL may be provided in the first to third pixel regions PXA1, PXA2, and PXA3. The pixels PXL may include a display element that emits light. For example, the display element may be any one of a liquid crystal display (LCD) element, an electrophoretic display (EPD) element, an electrowetting display (EWD) element, and an organic light emitting display (OLED) element. For convenience of description, the OLED element will be described below as an example.

The pixel PXL may emit light of one of red, green, and blue, but the present disclosure is not limited thereto. For example, the pixel PXL may emit light of a color such as cyan, magenta, yellow, or white.

The pixels PXL may include first pixels PXL1 arranged in the first pixel region PXA1, second pixels PXL2 arranged in the second pixel region PXA2, and third pixels PXL3 arranged in the third pixel region PXA3. In an embodiment, each of the first to third pixels PXL1, PXL2, and PXL3 may be provided in plurality to be arranged in a matrix form along rows extending in the first direction DR1 and columns extending in the second direction DR2. However, the arrangement of the first to third pixels PXL1, PXL2, and PXL3 is not particularly limited, and the first to third pixels PXL1, PXL2, and PXL3 may be arranged in various suitable forms. For example, the first pixels PXL1 may be arranged such that the first direction DR1 becomes the row direction, but the second pixels PXL2 may be arranged such that a direction different from the first direction DR1, for example, a direction diagonal to the first direction DR1, becomes the row direction. In addition, it will be apparent that the third pixels PXL3 may be arranged in a direction identical to or different from that of the first pixels PXL1 and/or the second pixels PXL2. Alternatively, in another embodiment, the row direction may become the second direction DR2, and the column direction may become the first direction DR1.

In the second region A2 and the third region A3, the number of second pixels PXL2 and third pixels PXL3 may be changed depending on rows. For example, in the second region A2 and the third region A3, the length of a row disposed in the second sub-region SA2 may be less than that of a row disposed in the first sub-region SA1. The number of second pixels PXL2 and third pixels PXL3, which are arranged on the row, may be decreased as the length of the row is shortened. Therefore, in the second region A2 and the third region A3, the number of second pixels PXL2 and third pixels PXL3 (which are arranged in a row disposed in the second sub-region SA2) may be smaller than that of second pixels PXL2 and third pixels PXL3, which are arranged in a row disposed in the first sub-region SA1. In addition, as the length of the row is shortened, the lengths of lines for connecting the second pixels PXL2 and the third pixels PXL3 may be shortened.

The drive unit may include scan drivers SDV1, SDV2, and SDV3 (hereinafter, referred to as SDV) for providing a scan signal to each pixel PXL along a scan line, light emitting drivers EDV1, EDV2, and EDV3 (hereinafter, referred to as EDV) for providing a light emitting control signal to each pixel PXL along a light emitting control line, a data driver DDV for providing a data signal to each PXL along a data line, and a timing controller. The timing controller may control the scan driver SDV, the light emitting driver EDV, and the data driver DDV.

In an embodiment, the scan drivers SDV may include a first scan driver SDV1 connected to the first pixels PXL1, a second scan driver SDV2 connected to the second pixels PXL2, and a third scan driver SDV3 connected to the third pixels PXL3. In an embodiment, the light emitting drivers EDV may include a first light emitting driver EDV1 connected to the first pixels PXL1, a second light emitting driver EDV2 connected to the second pixels PXL2, and a third light emitting driver EDV3 connected to the third pixels PXL3.

The first scan driver SDV1 may be disposed at the longitudinal part in the first peripheral region PPA1. Because the longitudinal I part of the first peripheral region PPA1 is provided in a pair spaced apart from each other along the width direction of the first pixel region PXA1, the first scan driver SDV1 may be disposed at at least one side of the longitudinal part of the first peripheral region PPA1. The first scan driver SDV1 may extend lengthwise along the length direction of the first peripheral region PPA1.

In a similar manner, the second scan driver SDV2 may be disposed in the second peripheral region PPA2, and the third scan driver SDV3 may be disposed in the third peripheral region PPA3.

In an embodiment, the scan drivers SDV may be directly mounted on the substrate SUB. When the scan drivers SDV are directly mounted on the substrate SUB, the scan drivers SDV may be formed together with the pixels PXL in a process of forming the pixels PXL. However, the mounting position and forming method of the scan drivers SDV are not limited thereto. For example, the scan drivers SDV may be formed on a separate chip to be provided in the form of a chip on glass on the substrate SUB. Alternatively, the scan drivers SDV may be mounted on a printed circuit board to be connected to the substrate SUB through a connection member.

Similarly to the first scan driver SDV1, the first light emitting driver EDV1 may also be disposed at the longitudinal part in the first peripheral region PPA1. The first light emitting driver EDV1 may be disposed at at least one side of the longitudinal part of the first peripheral region PPA1. The first light emitting driver EDV1 may extend lengthwise along the length direction of the first peripheral region PPA1.

In a similar manner, the second light emitting driver EDV2 may be disposed in the second peripheral region PPA2, and the third light emitting driver EDV3 may be disposed in the third peripheral region PPA3.

In an embodiment, the light emitting drivers EDV may be directly mounted on the substrate SUB. When the light emitting drivers EDV are directly mounted on the substrate SUB, the light emitting drivers EDV may be formed together with the pixels PXL in the process of forming the pixels PXL. However, the mounting position and forming method of the light emitting drivers EDV are not limited thereto. For example, the light emitting drivers EDV may be formed on a separate chip to be provided in the form of a chip on glass on the substrate SUB. Alternatively, the light emitting drivers EDV may be mounted on a printed circuit board to be connected to the substrate SUB through a connection member.

In the embodiments of the present disclosure, a case where the scan drivers SDV and the light emitting drivers EDV are adjacent to each other and formed at only one side of the pair of longitudinal parts of the peripheral regions PPA is illustrated as an example, but the present disclosure is not limited thereto. The arrangement of the scan drivers SDV and the light emitting drivers EDV may be changed in various suitable manners. For example, the first scan driver SDV1 may be provided at one side of the longitudinal part of the first peripheral region PPA1, and the first light emitting driver EDV1 may be provided at the other side of the longitudinal part of the first peripheral region PPA1. Alternatively, the first scan driver SDV1 may be provided at both the sides of the longitudinal part of the first peripheral region PPA1, and the first light emitting driver EDV1 may be provided at only one side of the longitudinal part of the first peripheral region PPA1.

The data driver DDV may be disposed in the first peripheral region PPA1. For example, the data driver DDV may be disposed at the lateral part of the first peripheral region PPA1. The data driver DDV may extend lengthwise along the width direction of the first peripheral region PPA1.

In an embodiment, the positions of the scan drivers SDV, the light emitting drivers EDV, and/or the data driver DDV may be changed, if necessary.

The timing controller may be connected, in various suitable manners, to the first to third scan drivers SDV1, SDV2, and SDV3, the first to third light emitting drivers EDV1, EDV2, and EDV3, and the data driver DDV through electrical lines. The position at which the timing controller is disposed is not particularly limited. For example, the timing controller may be mounted on a printed circuit board to be connected to the first to third scan drivers SDV1, SDV2, and SDV3, the first to third light emitting drivers EDV1, EDV2, and EDV3, and the data driver DDV through the flexible printed circuit board. The printed circuit board may be disposed at various suitable positions such as one side of the substrate SUB and a back side of the substrate SUB.

In addition, one of the second and third scan drivers SDV2 and SDV3 and one of the second and third light emitting drivers EDV2 and EDV3 may be omitted in a configuration in which a scan line or light emitting control line of the second pixels PXL2 and the third pixels PXL3, which correspond to the same row, is electrically connected through a scan line connection unit (e.g., a scan line connector) or a light emitting control line connection unit (e.g., a control line connector).

The length of the scan line or light emitting line of the second pixels PXL2 and the third pixels PXL3 may be suitably changed depending on positions. For example, in the second region A2 and the third region A3, the length of a scan line or light emitting control line that is distant from the first region A1 may be smaller than that of a scan line or light emitting control line that is close to the first region A1.

The power supply unit may include at least one power supply line ELVDD and ELVSS. For example, the power supply unit may include a first power supply line ELVDD and a second power supply line ELVSS. The first power supply line ELVDD and the second power supply line ELVSS may supply power to the first pixel PXL1, the second pixel PXL2, and the third pixel PXL3.

One of the first power supply line ELVDD and the second power supply line ELVSS (e.g., the first power supply line ELVDD) may be disposed to at least correspond to one side of the first peripheral region PPA1, one side of the second peripheral region PPA2, and one side of the third peripheral region PPA3. For example, the first power supply line ELVDD may be disposed in a region in which the data driver DDV of the first peripheral region PPA1 is disposed. In addition, the first power supply line ELVDD may extend in the width direction of the first pixel region PXA1.

The other of the first power supply line ELVDD and the second power supply line ELVSS, for example, the second power supply line ELVSS, may be disposed to surround the first pixel region PXA1, the second pixel region PXA2, and the third pixel region PXA3, except the region in which the data driver DDV of the first peripheral region PPA1 is disposed. For example, the second power supply line ELVSS may have a shape extending along the left longitudinal part of the first peripheral region PPA1, the second peripheral region PPA2, the third peripheral region PPA3, the additional peripheral region APA, and the right longitudinal part of the second peripheral region PPA2.

In the above, a case where the first power supply line ELVDD is disposed to correspond to one side of the first pixel region PXA1 in the first peripheral region PPA1 and the second power supply line ELVSS is disposed in the other peripheral regions is described as an example, but the present disclosure is not limited thereto. For example, the first power supply line ELVDD and the second power supply line ELVSS may be disposed to surround the first pixel region PXA1, the second pixel region PXA2, and the third pixel region PXA3.

A voltage applied to the first power supply line ELVDD may be higher than that applied to the second power supply line ELVSS.

Figure 10:
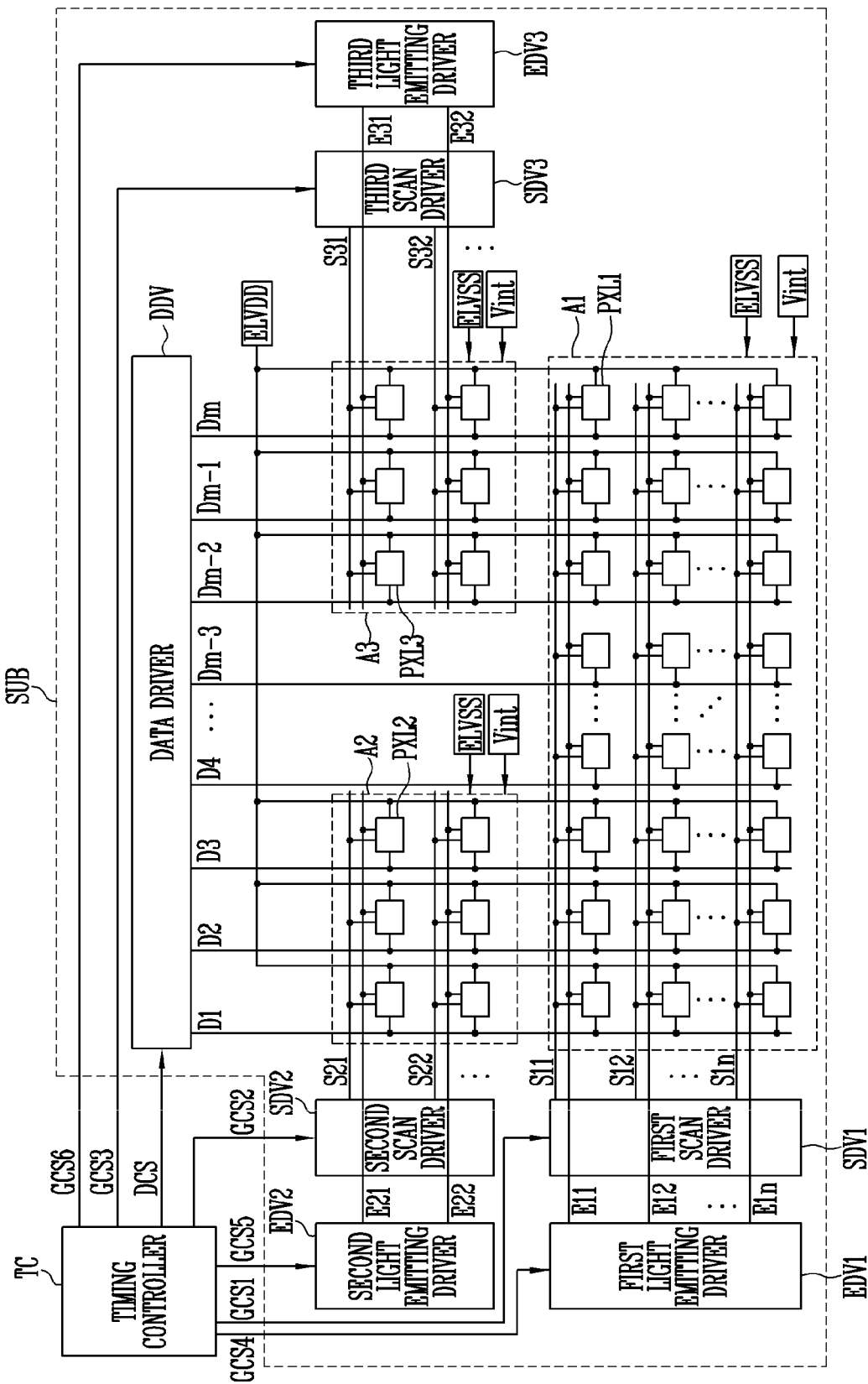
FIG. 10 is a block diagram illustrating pixels and a driver in a display device according to an embodiment of the present disclosure.

FIG. 10 is a block diagram illustrating pixels and a driver in a display device according to an embodiment of the present disclosure.

Referring to FIG. 10, the display device according to the embodiment of the present disclosure may include pixels PXL, a drive unit, and a line unit.

The pixels PXL may include first to third pixels PXL1, PXL2, and PXL3, and the drive unit may include first to third scan drivers SDV1, SDV2, and SDV3, first to third light emitting drivers EDV1, EDV2, and EDV3, a data driver DDV, and a timing controller TC. In FIG. 10, the position of each of the first to third scan drivers SDV1, SDV2, and SDV3, the first to third light emitting drivers EDV1, EDV2, and EDV3, the data driver DDV, and the timing controller TC are set for convenience of description. When an actual display device is implemented, each of the first to third scan drivers SDV1, SDV2, and SDV3, the first to third light emitting drivers EDV1, EDV2, and EDV3, the data driver DDV, and the timing controller TC may be disposed at another position in the display device. For example, the data driver DDV is disposed in a region closer to a second region A2 and a third region A3 than a first region A1, but the present disclosure is not limited thereto. For example, it will be apparent that the data driver DDV may be disposed in a region that is adjacent to the first region A1.

The line unit provides signals of the drive unit to each pixel PXL, and may include scan lines, data lines, light emitting control lines, a power line, and an initialization power line (not shown). The scan lines may include first to third scan lines S11 to Si1n, S21 to S2n, and S31 to S3n respectively connected to the first to third pixels PXL1, PXL2, and PXL3, and the light emitting control lines may include first to third light emitting lines E11 to E1n, E21 to E2n, and E31 to E3n respectively connected to the first to third pixels PXL1, PXL2, and PXL3. The data lines D1 to Dm and the power line may be connected to the first to third pixels PXL1, PXL2, and PXL3.

The first pixels PXL1 are located in the first pixel region PXA1. The first pixels PXL1 may be connected to first scan lines S11 to Si1n, first light emitting control lines E11 to E1n, and the data lines D1 to Dm. The first pixels PXL1 receive a data signal from the data lines D1 to Dm when a scan signal is supplied from the first scan lines S11 to S1n. The first pixels PXL1 receiving the data signal may control the amount of current flowing in a second power source ELVSS via an organic light emitting device from a first power source ELVDD.

The second pixels PL2 are located in the second pixel region PXA2. The second pixels PXL2 are connected to second scan lines S21 and S22, second light emitting control lines E21 and E22, and data lines D1 to D3. The second pixels PXL2 receive a data signal from the data lines D1 to D3 when a scan signal is supplied from the second scan lines S21 and S22. The second pixels PXL2 receiving the data signal may control the amount of current flowing in the second power source ELVSS via the organic light emitting device from the first power source ELVDD.

Additionally, in FIG. 10, it has been illustrated that six second pixels PXL2 are located in the second pixel region PXA2 defined by the two second scan lines S21 and S22, the two second light emitting control lines E21 and E22, and the three data lines D1 to D3, but the present disclosure is not limited thereto. That is, a plurality of second pixels PXL2 may be arranged to correspond to the size of the second pixel region PXA2, and the number of second scan lines, second light emitting control lines, and data lines may be variously set corresponding to the number of second pixels PXL2.

The third pixels PXL3 are located in the third pixel region PXA3 defined by third scan lines S31 and S32, third light emitting control lines E31 and E32, and data lines Dm-2 to Dm. The third pixels PXL3 receive a data signal from the data lines Dm-2 to Dm when a scan signal is supplied from the third scan lines S31 and S32. The third pixels PXL3 receiving the data signal may control the amount of current flowing in the second power source ELVSS via the organic light emitting device from the first power source ELVDD.

Additionally, in FIG. 10, it has been illustrated that six third pixels PXL3 are located in the third pixel region PXA3 defined by the two third scan lines S31 and S32, the two third light emitting control lines E31 and E32, and the three data lines Dm-2 to Dm; however, the present disclosure is not limited thereto. That is, a plurality of third pixels PXL3 may be arranged to correspond to the size of the third pixel region PXA3, and the number of third scan lines, third light emitting control lines, and data lines may be variously set corresponding to the number of third pixels PXL3.

The first scan driver SDV1 may supply a scan signal to the first scan lines S11 to Si1n in response to a first gate control signal GCS1 from the timing controller TC. For example, the first scan driver SDV1 may sequentially supply the scan signal to the first scan lines S11 to S1n. If the scan signal is sequentially supplied to the first scan lines S11 to Si1n, the first pixels PXL1 may be sequentially selected in units of horizontal lines.

The second scan driver SDV2 may supply a scan signal to the second scan lines S21 and S22 in response to a second gate control signal GCS2 from the timing controller TC. For example, the second scan driver SDV2 may sequentially supply the scan signal to the second scan lines S21 and S22. If the scan signal is sequentially supplied to the second scan lines S21 and S22, the second pixels PXL2 may be sequentially selected in units of horizontal lines.

The third scan driver SDV3 may supply a scan signal to the third scan lines S31 and S32 in response to a third gate control signal GCS3 from the timing controller TC. For example, the third scan driver SDV3 may sequentially supply the scan signal to the third scan lines S31 and S32. If the scan signal is sequentially supplied to the third scan lines S31 and S32, the third pixels PXL3 may be sequentially selected in units of horizontal lines.

The first light emitting driver EDV1 may supply a light emitting control signal to the first light emitting control lines E11 to E1n in response to a fourth gate control signal GCS4. For example, the first light emitting driver EDV1 may sequentially supply the light emitting control signal to the first light emitting control lines E11 to E1n.

Here, the light emitting control signal may be set to have a greater width than the scan signal. For example, a light emitting control signal supplied to an ith (i is a natural number) first light emitting control line E1$i$ may be supplied to overlap with, for at least one period, a scan signal supplied to an (i−1)th first scan line S1$i$−1 and a scan signal supplied to an ith first scan line S1$i$.

The second light emitting driver EDV2 may supply a light emitting control signal to the second light emitting control lines E21 and E22 in response to a fifth gate control signal GCS5. For example, the second light emitting driver EDV2 may sequentially supply the light emitting control signal to the second light emitting control lines E21 and E22.

The third light emitting driver EDV3 may supply a light emitting control signal to the third light emitting control lines E31 and E32 in response to a sixth gate control signal GCS6. For example, the third light emitting driver EDV3 may sequentially supply the light emitting control signal to the third light emitting control lines E31 and E32.

Additionally, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 to GCS6 generated based on timing signals supplied from the outside. Also, the timing controller TC may supply the data control signal DCS to the data driver DDV.

A start pulse and clock signals may be included in each of the gate control signals GCS1 to GCS6. The start pulse may control a timing of a first scan signal or a first light emitting control signal. The clock signals may be used to shift the start pulse.

A source start pulse and clock signals may be included in the data control signal DCS. The source start pulse may control a sampling start time of data. The color signals may be used to control a sampling operation.

When the display device is sequentially driven, the first scan driver SDV1 may receive, as a start pulse, the last output signal of the second scan driver SDV2. In this case, the first scan driver SDV1 and the second scan driver SDV2 may share control signals. Therefore, the timing controller TC may supply the gate control signal GCS2 to the second scan driver SDV2, and may not supply the gate control signal GCS1 to the first scan driver SDV1.

Similarly, when a separate scan driver for driving the first pixels PXL1 is added under the third scan driver SDV3, the added scan driver and the third scan driver SDV3 may share control signals. In addition, the added scan driver may receive, as a start pulse, the last scan signal of the third scan driver SDV3.

When the display device is sequentially driven, the first light emitting driver EDV1 may receive, as a start pulse, the last output signal of the second light emitting driver EDV2. In this case, the first light emitting driver EDV1 and the second light emitting driver EDV2 may share control signals. Therefore, the timing controller TC may supply the gate control signal GCS5 to the second light emitting driver EDV2, and may not supply the gate control signal GCS4 to the first light emitting driver EDV1.

Similarly, when a separate light emitting driver for driving the first pixels PXL1 is added under the third light emitting driver EDV3, the added light emitting driver and the third light emitting driver EDV3 may share control signals. In addition, the added light emitting driver may receive, as a start pulse, the last light emitting control signal of the third light emitting driver EDV3.

Figure 11:
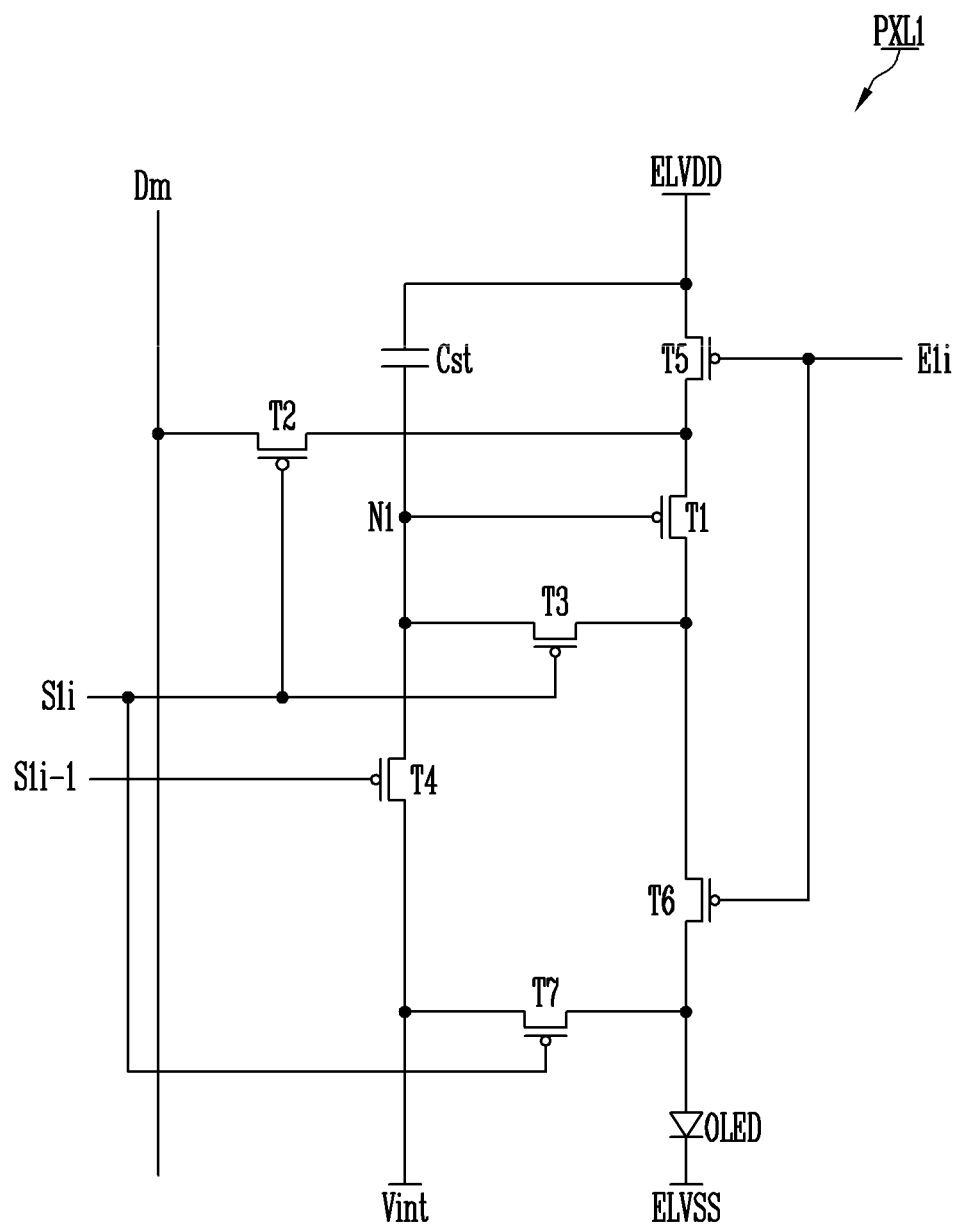
FIG. 11 is an equivalent circuit diagram illustrating an embodiment of a first pixel shown in FIG. 10.

FIG. 11 is an equivalent circuit diagram illustrating an embodiment of the first pixel shown in FIG. 10. For convenience of description, a pixel connected to an mth data line Dm and an ith first scan line S1$i$ will be illustrated in FIG. 11.

Referring to FIG. 11, the first pixel PXL1 according to the embodiment of the present disclosure may include an organic light emitting device OLED, first to seventh transistors T1 to T7, and a storage capacitor Cst.

An anode of the organic light emitting device OLED may be connected to the first transistor T1 via the sixth transistor T6, and a cathode of the organic light emitting device OLED may be connected to a second power source ELVSS. The organic light emitting device OLED may generate light of a set or predetermined luminance corresponding to the amount of current supplied from the first transistor T1.

A first power source ELVDD may be set to a higher voltage than the second power source ELVSS such that current can flow in the organic light emitting device OLED.

The seventh transistor T7 may be connected between an initialization power source Vint and the anode of the organic light emitting device OLED. In addition, a gate electrode of the seventh transistor T7 may be connected to the ith first scan line S1$i$. The seventh transistor T7 may be turned on when a scan signal is supplied to the ith first scan line S1$i$, to supply a voltage of the initialization power source Vint to the anode of the organic light emitting device OLED. Here, the initialization power source Vint may be set to a lower voltage than a data signal.

The sixth transistor T6 may be connected between the first transistor T1 and the organic light emitting device OLED. In addition, a gate electrode of the sixth transistor T6 may be connected to an ith first light emitting control line E1$i$. The sixth transistor T6 may be turned off when a light emitting control signal is supplied to the ith first light emitting control line E1$i$, and may be turned off otherwise.

The fifth transistor T5 may be connected between the first power source ELVDD and the first transistor T1. In addition, a gate electrode of the fifth transistor T5 may be connected to the ith first light emitting control line E1$i$. The fifth transistor T5 may be turned off when a light emitting control signal is supplied to the ith first light emitting control line E1$i$, and may be turned on otherwise.

A first electrode of the first transistor (drive transistor) T1 may be connected to the first power source ELVDD via the fifth transistor T5, and a second electrode of the first transistor T1 may be connected to the anode of the organic light emitting device OLED via the sixth transistor T6. In addition, a gate electrode of the first transistor T1 may be connected to a first node N1. The first transistor T1 may control the amount of current flowing in the second power source ELVSS via the organic light emitting device OLED from the first power source ELVDD, corresponding to a voltage of the first node N1.

The third transistor T3 may be connected between the second electrode of the first transistor T1 and the first node N1. In addition, a gate electrode of the third transistor T3 may be connected to the ith scan line S1$i$. The third transistor T3 may be turned on when a scan signal is supplied to the ith scan line S1$i$, to allow the second electrode of the first transistor T1 to be electrically connected to the first node N1. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to an (i−1)th first scan line S1$i$−1. The fourth transistor T4 may be turned on when a scan signal is supplied to the (i−1)th first scan line S1$i$−1, to supply the voltage of the initialization power source Vint to the first node N1.

The second transistor T2 may be connected between the mth data line Dm and the first electrode of the first transistor T1. In addition, a gate electrode of the second transistor T2 may be connected to the ith first scan line S1$i$. The second transistor T2 may be turned on when a scan signal is supplied to the ith first scan line S1$i$, to allow the mth data line Dm to be electrically connected to the first electrode of the first transistor T1.

The storage capacitor Cst may be connected between the first power source ELVDD and the first node N1. The storage capacitor Cst may store a sum of a voltage representing the data signal and a voltage corresponding to a threshold voltage of the first transistor T1.

Each of the second and third pixels PXL2 and PXL3 may be implemented with the same circuit as the first pixel PXL1. Therefore, detailed descriptions of the second and third pixels PXL2 and PXL3 may not be repeated.

As described above, according to an embodiment, the pixels PXL may be provided in the regions A1, A2, and A3 having different areas. The lengths of the scan lines and light emitting control lines for providing signals to the pixels PXL may be changed depending on areas of the regions A1, A2, and A3, for example, the pixel regions PXA. For example, the first width W1 (see, e.g., FIG. 1) of the first pixel region PXA1 is longer than the second width W2 (see, e.g., FIG. 1) of the second pixel region PXA2. Accordingly, when the scan lines and the light emitting lines extend in the width direction of the pixel regions PXA, the lengths of the first scan lines S11 to S1$n$ and the first light emitting control lines E11 to E1$n$ are longer than those of the second scan lines S21 and S22 and the second light emitting control lines E21 and E22, respectively. The difference between the scan lines and the difference between the light emitting control lines may cause a difference in load value between the scan lines and the light emitting control lines. That is, the load value of the first scan lines S11 to S1$n$ may be greater than that of the second scan lines S21 and S22. Also, the load value of the first light emitting control lines E11 to E1$n$ may be greater than that of the second light emitting control line E21 and E22. The difference in load value may cause a voltage drop of a data signal provided to each pixel PXL. The voltage drop of the data signal may cause a difference in luminance between the first pixels PXL1 of the first pixel region PXA1 and the second pixels PXL2 of the second pixel region PXA2.

According to another embodiment, the extending directions of the scan lines and the light emitting control lines may be set differently from each other. However, embodiments of the present invention are not limited thereto, as for example, in the above-described embodiment, the scan lines and the light emitting control lines extend along the first direction DR1 as the width direction of the pixel regions PXA, and, another example, the scan lines and the light emitting control lines may extend along the second direction DR2 as the length direction of the pixel regions PXA. Here, the lengths of the scan lines and the light emitting control lines may be set to correspond to the first length L1 and the second length L2, respectively. Even in this case, a difference in load value between the scan lines and the light emitting control lines may be caused by the difference in length between the scan lines and the light emitting control lines. As a result, a difference in luminance between the pixels PXL may be caused.

In an embodiment, a dummy unit for compensating for a difference in load value is provided or is not provided for each pixel region PXA, so that the pixel regions PXA are configured to have different parasitic capacitances. In the following embodiment, the structure of overall pixels PXL will be first described using the first pixel PXL1 as an example, and then differences between the first pixel PXL1 and the second pixel PXL2 will be mainly described. In an embodiment, the third pixel PXL3 may be provided in the same form as the second pixel PXL2, and therefore, description of the third pixel PXL3 may not be repeated.

Figure 12:
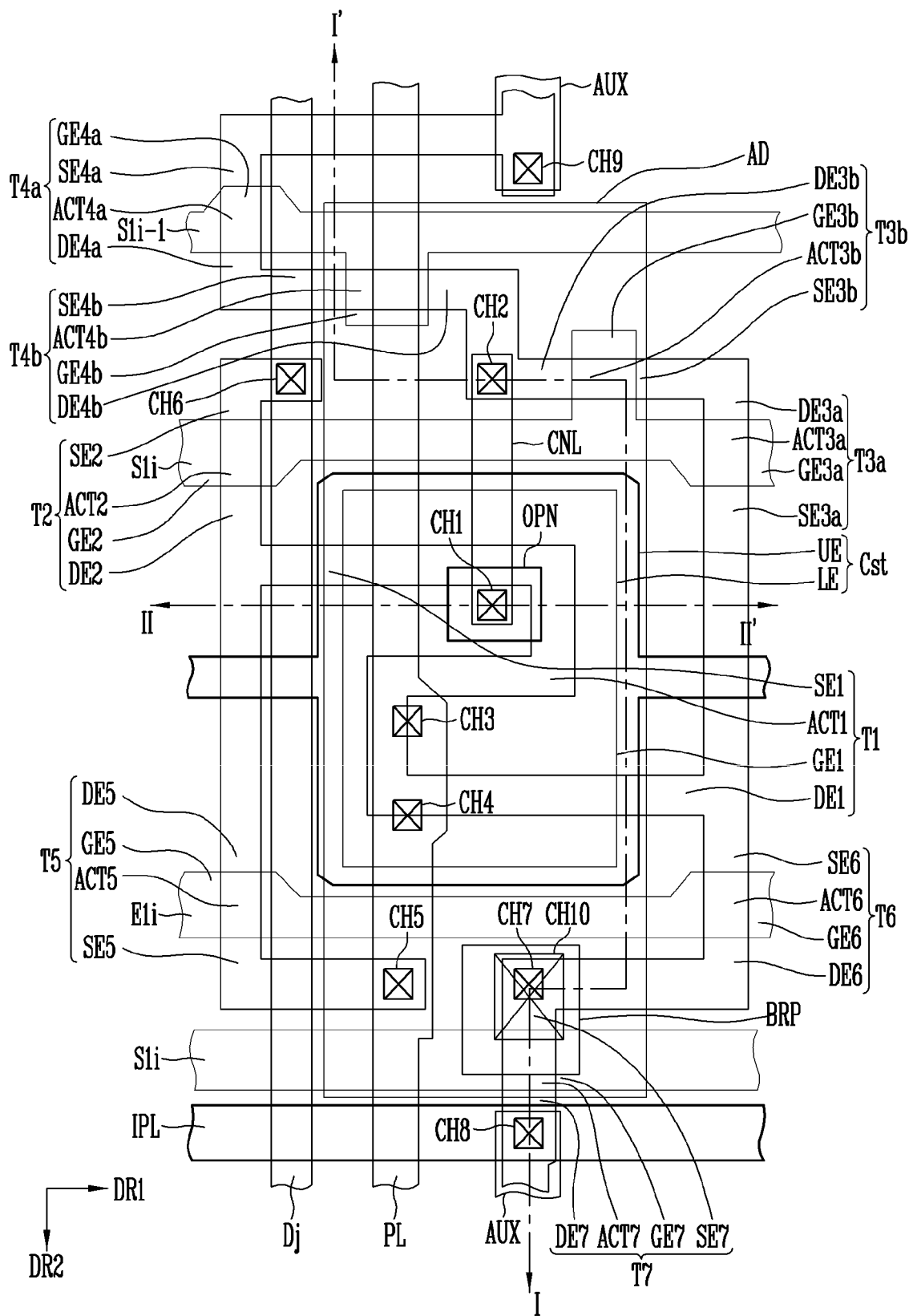
FIG. 12 is a plan view illustrating in detail the first pixel shown in FIG. 10.
Figure 13:
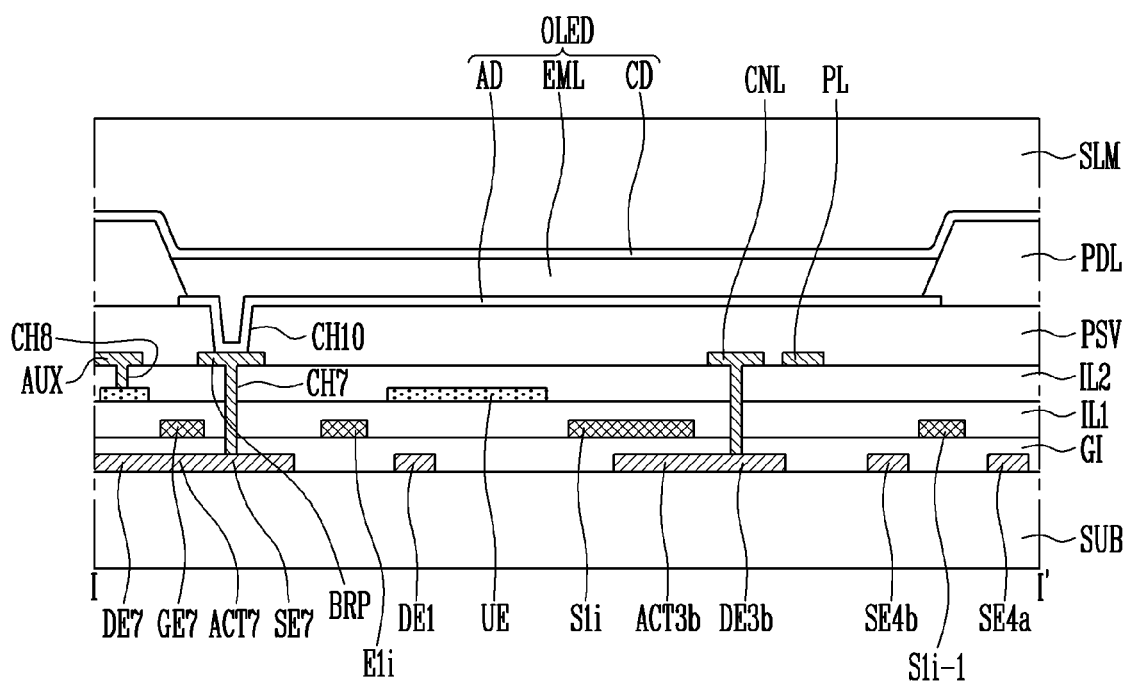
FIG. 13 is a sectional view taken along the line I-I' of FIG. 12.
Figure 14:
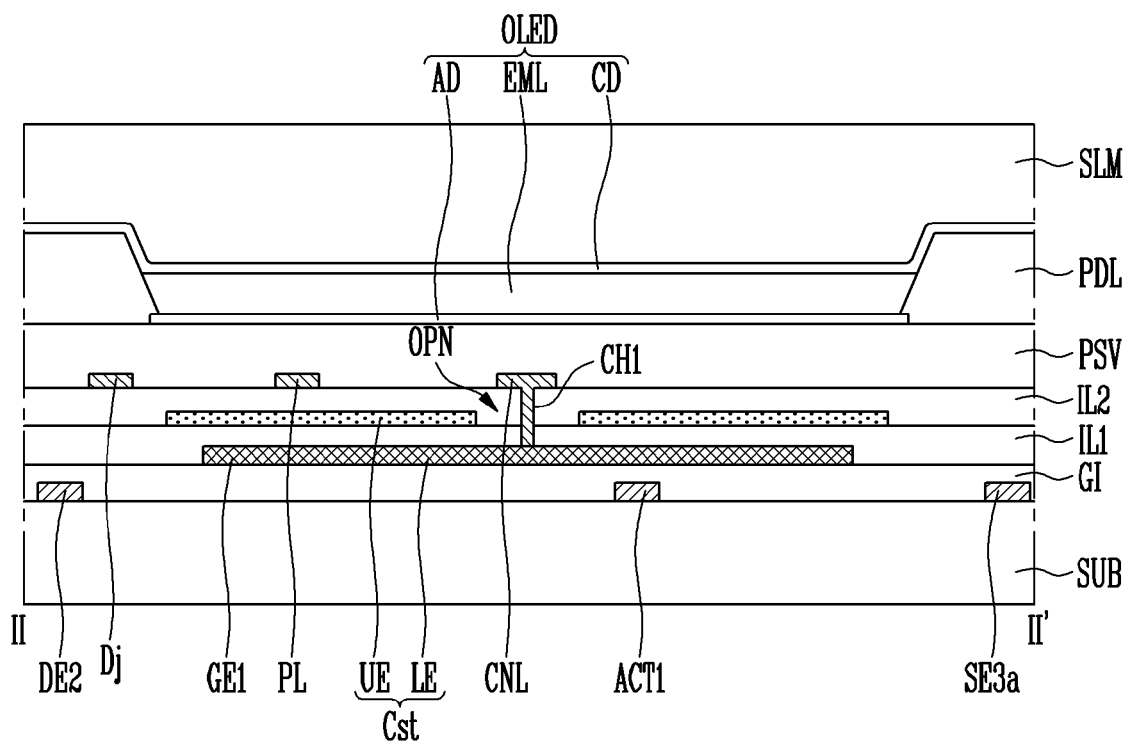
FIG. 14 is a sectional view taken along the line II-II' of FIG. 12.

FIG. 12 is a plan view illustrating in detail the first pixel shown in FIG. 10. FIG. 13 is a sectional view taken along the line I-I' of FIG. 12. FIG. 14 is a sectional view taken along the line II-II' of FIG. 12.

Based on one first pixel PXL1 disposed on an ith row and a jth column in the first pixel region PXA1, two first scan lines S1$i$−1 and S1$i$, a first light emitting control line E1$i$, a power line PL, and a data line Dj are illustrated in FIGS. 12 to 14. In FIGS. 12 to 14, for convenience of description, a first scan line on an (i−1)th row is referred to as an "(i−1)th first scan line S1$i$−1," a first scan line on the ith row is referred to as an "ith first scan line S1$i$," a first light emitting control line on the ith row is referred to as a "first light emitting control line E1$i$," a data line on the jth column is referred to as a "data line Dj," and a power line on the jth column is referred to as a "power line PL."

Referring to FIGS. 12 to 14, the display device may include a substrate SUB, a line unit, and pixels, for example, first pixels PXL1.

The substrate SUB may include a transparent insulating material such that light can be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate including a polymer organic material and a plastic substrate. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and/or the like. However, the material constituting the substrate SUB may be variously changed as suitable, and may include a fiber reinforced plastic (FRP), and/or the like.

The line unit provides a signal to each of the first pixels PXL1, and may include first scan lines S1$i$−1 and S1$i$, a data line Dj, a first light emitting control line E1$i$, a power line PL, and an initialization power line IPL.

The first scan lines S1$i$−1 and S1$i$ may extend in the first direction DR1. The first scan lines S1$i$−1 and S1$i$ may include an (i−1)th first scan line S1$i$−1 and an ith first scan line S1$i$, which are sequentially arranged along the second direction DR2. The first scan lines S1$i$−1 and S1$i$ may receive a scan signal. For example, the (i−1)th first scan line S1$i$−1 may receive an (i−1)th scan signal, and the ith first scan line S1$i$ may receive an ith scan signal. The ith first scan line S1$i$ may be divided into two lines, and the divided ith first scan lines S1$i$ may be connected to different transistors, respectively. For example, the ith first scan line S1$i$ may include an upper ith first scan line S1$i$ adjacent to the (i−1)th first scan line S1$i$−1 and a lower ith first scan line S1$i$ more distant from the (i−1)th first scan line S1$i$−1 than the upper ith first scan line S1$i$.

The first light emitting control line E1$i$ may extend in the first direction DR1. The first light emitting control line E1$i$ is disposed to be spaced apart from the two ith first scan lines S1$i$ between the ith first scan lines S1$i$. The first light emitting control line E1$i$ may receive a light emitting control signal.

The data line Dj may extend in the second direction DR2. The data line Dj may receive a data signal.

The power line PL may extend in the second direction DR2. The power line PL may be disposed to be spaced apart from the data line Dj. The power line PL may receive a first power source ELVDD.

The initialization power line IPL may extend along the first direction DR1. The initialization power line IPL may be provided between the lower ith first scan line S1$i$ and an (i−1)th first scan line S1$i$−1 of a pixel on the next row. The initialization power line IPL may receive an initialization power source Vint.

Each of the first pixels PXL1 may include first to seventh transistors T1 to T7, a storage capacitor Cst, and a light emitting device OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may be connected between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment, the first active pattern ACT1, the first source electrode SE1, and the first drain electrode DE1 may be formed of a semiconductor layer that is undoped or is doped with a dopant. For example, the first source electrode SE1 and the first drain electrode DE1 may be formed of a semiconductor layer doped with a dopant, and the active pattern ACT1 may be formed of an undoped semiconductor layer.

The first active pattern ACT1 has a bar shape extending in a set or predetermined direction, and may have a shape in which it is bent plural times along the extending direction. The first active pattern ACT1 may overlap with the first gate electrode GE when viewed on a plane. As the first active pattern ACT1 is formed long, a channel region of the first transistor T1 can be formed long. Thus, the driving range of a gate voltage applied to the first transistor T1 is widened. Accordingly, the gray level of light emitted from the light emitting device OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the upper ith first scan line S1$i$. The second gate electrode GE2 may be provided as a portion of the upper ith first scan line S1$i$ or may be provided in a shape protruding from the upper ith first scan line S1$i$. In an embodiment, the second active pattern ACT2, the second source electrode SE2, and the second drain electrode DE2 may be formed of a semiconductor that is undoped or is doped with a dopant. For example, the second source electrode SE2 and the second drain electrode DE2 may be formed of a semiconductor that is doped with a dopant, and the second active pattern ACT2 may be formed of an undoped semiconductor layer. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to reduce or prevent a leakage current. That is, the third transistor T3 may include a 3$ath$ transistor T3$a$ and a 3$bth$ transistor T3$b$. The 3$ath$ transistor T3$a$ may include a 3$ath$ gate electrode GE3$a$, a 3$ath$ active pattern ACT3$a$, a 3$ath$ source electrode SE3$a$, and a 3$ath$ drain electrode DE3$a$. The 3$bth$ transistor T3$b$ may include a 3$bth$ gate electrode GE3$b$, a 3$bth$ active pattern ACT3$a$, a 3$bth$ source electrode SE3$b$, and a 3$bth$ drain electrode DE3$b$. Hereinafter, the 3$ath$ gate electrode GE3$a$ and the 3$bth$ gate electrode GE3$b$ are referred to as a third gate electrode GE3, the 3$ath$ active pattern ACT3$a$ and the 3$bth$ active pattern ACT3$b$ are referred to as a third active pattern ACT3, the 3$ath$ source electrode SE3$a$ and the 3$bth$ source electrode SE3$b$ are referred to as a third source electrode SE3, and the 3$ath$ drain electrode DE3$a$ and the 3$bth$ drain electrode DE3$b$ are referred to as the third drain electrode DE3.

The third gate electrode GE3 may be connected to the upper ith first scan line S1$i$. The third gate electrode GE3 may be provided as a portion of the upper ith first scan line S1$i$ or may be provided in a shape protruding from the upper ith first scan line S1$i$. For example, the 3$ath$ gate electrode GE3$a$ may be provided in a shape protruding from the upper ith first scan line S1$i$, and the 3$bth$ gate electrode GE3$b$ may be provided as a portion of the upper ith first scan line S1$i$.

The third active pattern ACT, the third source electrode SE3, and the third drain electrode DE3 may be formed of a semiconductor layer that is undoped or is doped with a dopant. For example, the third source electrode SE3 and the third drain electrode DE3 may be formed of a semiconductor layer that is doped with a dopant, and the third active pattern ACT3 may be formed of an undoped semiconductor layer. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure so as to reduce or prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 may be connected to the (i−1)th first scan line S1i−1. The fourth gate electrode GE4 may be provided as a portion of the (i−1)th first scan line S1i−1 or may be provided in a shape protruding from the (i−1)th first scan line S1i−1. For example, the 4ath gate electrode GE4a may be provided as a portion of the (i−1)th first scan line S1i−1. The 4bth gate electrode GE4b may be provided in a shape protruding from the (i−1)th first scan line S1i−1.

The fourth active pattern ACT4, the fourth source electrode SE4, and the fourth drain electrode DE4 may be formed of a semiconductor layer that is undoped or is doped with a dopant. For example, the fourth source electrode SE4 and the fourth drain electrode DE4 may be formed of a semiconductor layer that is doped with a dopant, and the fourth active pattern ACT4 may be formed of an undoped semiconductor layer. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a first pixel PXL1 on an (i−1)th row and a seventh drain electrode DE7 of a seventh transistor T7 of the first pixel PXL1 on the (i−1)th row. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the first pixel PXL1 on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first light emitting control line E1i. The fifth gate electrode GE5 may be provided as a portion of the first light emitting control line E1i or may be provided in a shape protruding from the first light emitting control line E1i. The fifth active pattern ACT, the fifth source electrode SE5, and the fifth drain electrode DE5 may be formed of a semiconductor layer that is undoped or is doped with a dopant. For example, the fifth source electrode SE5 and the fifth drain electrode DE5 may be formed of a semiconductor layer that is doped with a dopant, and the fifth active pattern ACT5 may be formed of an undoped semiconductor layer. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the first light emitting control line E1i. The sixth gate electrode SE6 may be provided as a portion of the first light emitting control line E1i or may be provided in a shape protruding from the first light emitting control line E1i. The sixth active pattern ACT6, the sixth source electrode SE6, and the sixth drain electrode DE6 may be formed of a semiconductor layer that is undoped or is doped with a dopant. For example, the sixth source electrode SE6 and the sixth drain electrode DE6 may be formed of a semiconductor layer that is doped with a dopant, and the sixth active pattern ACT6 may be formed of an undoped semiconductor layer. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the lower ith first scan line S1i. The seventh gate electrode GE7 may be provided as a portion of the lower ith first scan line S1i or may be provided in a shape protruding from the lower ith first scan line S1i. The seventh active pattern ACT7, the seventh source electrode SE7, and the seventh drain electrode DE7 may be formed of a semiconductor layer that is undoped or is doped with a dopant. For example, the seventh source electrode SE7 and the seventh drain electrode DE7 may be formed of a semiconductor layer doped with a dopant, and the seventh active layer ACT7 may be formed of an undoped semiconductor layer. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a first pixel PXL on an (i+1)th row. The seventh drain electrode DE7 may be connected to the fourth source electrode SE4 of the fourth transistor T4 of the first pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be formed as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment, a voltage having the same level as the first power source may be applied to the upper electrode UE. The upper electrode UE may have an opening OPN in a region including the first contact hole CH through which the first gate electrode GE1 and the connection line CNL contact each other.

The light emitting device OLED may include a first electrode AD, a second electrode CD, and a light emitting layer EML provided between the first electrode AD and the second electrode CD.

The first electrode AD may be provided in a light emitting region corresponding to each pixel PXL1. The first electrode AD may be connected to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The bridge pattern BRP may connect the first electrode AD to the sixth drain electrode DE6 and the seventh source electrode SE7.

Hereinafter, a structure of a display device according to an embodiment of the present disclosure will be described according to a stacking order with reference to FIGS. 12 to 14.

An active patterns ACT1 to ACT7 (hereinafter, referred to as ACT) may be provided on a substrate SUB. The active pattern may include first to seventh active patterns ACT1 to ACT7. The first to seventh active patterns ACT1 to ACT7 may be formed of a semiconductor material.

A buffer layer may be provided between the substrate SUB and the first to seventh active patterns ACT1 to ACT7.

A gate insulating layer GI may be provided on the substrate SUB on which the first to seventh active patterns ACT1 to ACT7 are formed.

An (i−1)th first scan line S1$i$−1, an ith first scan line S1$i$, a light emitting control line E1$i$, and first to seventh gate electrodes GE1 to GE7 may be provided on the gate insulating layer GI. The first gate electrode GE1 may be a lower electrode LE of a storage capacitor Cst. The second gate electrode GE2 and the third gate electrode GE3 may be integrally formed with an upper ith first scan line S1$i$. The fourth gate electrode GE4 may be integrally formed with the (i−1)th first scan line S1$i$−1. The fifth gate electrode GE5 and the sixth gate electrode GE6 may be integrally formed with the light emitting control line E1$i$. The seventh gate electrode GE7 may be integrally formed with a lower ith first scan line S1$i$.

A first interlayer insulating layer IL1 may be provided on the substrate SUB on which the (i−1)th first scan line S1$i$−1 and the like are formed.

An upper electrode of the storage capacitor Cst and an initialization power line IPL may be provided on the first interlayer insulating layer IL1. The upper electrode UE may cover the lower electrode LE. The upper electrode UE and the lower electrode LE may constitute the storage capacitor Cst together with the first interlayer insulating layer IL1.

A second interlayer insulating layer IL2 may be provided on the substrate SUB on which the upper electrode UE and the initialization power line IPL are disposed.

A data line Dj, a power line PL, a connection line CNL, an auxiliary connection line AUX, and a bridge pattern BRP may be provided on the second interlayer insulating layer IL2.

The data line Dj may be connected to a second source electrode SE2 through a sixth contact hole CH6 passing through the first interlayer insulating layer IL1, the second interlayer insulating layer IL2, and the gate insulating layer GI. The power line PL may be connected to the upper electrode UE of the storage capacitor Cst through third and fourth contact holes CH3 and CH4 passing through the second interlayer insulating layer IL2.

The power line PL may also be connected to a fifth source electrode SE5 through a fifth contact hole CH5 passing through the first interlayer insulating layer IL1, the second interlayer insulating layer IL2, and the gate insulating layer GI.

The connection line CNL may be connected to the first gate electrode GE1 through a first contact hole CH1 passing through the first interlayer insulating layer IL1 and the second interlayer insulating layer IL2. Also, the connection line CNL may be connected to a third drain electrode DE3 and a fourth drain electrode DE4 through a second contact hole CH2 passing through the gate insulating layer GI, the first interlayer insulating layer IL1, and the second interlayer insulating layer IL2.

The auxiliary connection line AUX may be connected to the initialization power line IPL through an eighth contact hole CH8 passing through the second interlayer insulating layer IL2. Also, the auxiliary connection line AUX may be connected to a fourth source electrode SE4 and a seventh drain electrode DE7 of a first pixel PXL1 on an (i−1)th row through a ninth contact hole CH9 passing through the gate insulating layer GI, the first interlayer insulating layer IL1, and the second interlayer insulating layer IL2.

The bridge pattern BRP may be a pattern provided as a medium connecting a sixth drain electrode DE6 to a first electrode AD between the sixth drain electrode DE6 and the first electrode AD. The bridge pattern BRP may be connected to the sixth drain electrode DE6 and a seventh source electrode SE7 through a seventh contact hole CH7 passing through the gate insulating layer GI, the first interlayer insulating layer IL1, and the second interlayer insulating layer IL2.

A protective layer PSV may be provided on the substrate SUB on which the data line Dj and the like are formed.

A light emitting device OLED may be provided on the protective layer PSV. The light emitting device OLED may include the first electrode AD, a second electrode CD, and a light emitting layer EML provided between the first electrode AD and the second electrode CD.

The first electrode AD may be provided on the protective layer PSV. The first electrode AD may be connected to the bridge pattern BRP through a tenth contact hole CH10 passing through the protective layer PSV. Because the bridge pattern BRP is connected to the sixth drain electrode DE6 and the seventh source electrode SE7 through the seventh contact hole CH7, the first electrode AD may be finally connected to the sixth drain electrode DE6 and the seventh source electrode SE7.

A pixel defining layer PDL dividing a light emitting region to correspond to each pixel PXL may be provided on the substrate SUB on which the first electrode AD and the like are formed. The pixel defining layer PDL may protrude from the substrate SUB along the periphery of the pixel PXL while exposing a top surface of the first electrode AD.

The light emitting layer EML may be provided in the light emitting region surrounded by the pixel defining layer PDL, and the second electrode CD may be provided on the light emitting layer EML. A sealing layer SLM covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device OLED is a bottom-emission organic light emitting device, the first electrode AD may be a transmissive electrode, and the second electrode CD is a reflective electrode. When the light emitting device OLED is a top-emission organic light emitting device, the first electrode AD may be a reflective electrode, and the second electrode CD may be a transmissive electrode. When the light emitting device OLED is a dual-emission light emitting device, both of the first electrode AD and the second electrode CD may be transmissive electrodes. In this embodiment, a case where the light emitting device OLED is a top-emission organic light emitting device, and the first electrode AD is an anode electrode will be described as an example.

The first electrode AD may include a reflective layer capable of reflecting light and a transparent conductive layer disposed over or under the reflective layer. At least one of the transparent conductive layer and the reflective layer may be connected to the drain electrode DE.

The reflective layer may include a material capable of reflecting light. For example, the reflective layer may include at least one of aluminum (Al), silver (Ag), chromium (Cr), molybdenum (Mo), platinum (Pt), nickel (Ni), alloys thereof, and/or the like.

The transparent conductive layer may include a transparent conductive oxide. For example, the transparent conductive layer may include at least one transparent conductive oxide selected from the group consisting of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin, and/or the like.

The light emitting layer EML may be disposed on the exposed surface of the first electrode AD. The light emitting layer EML may have a multi-layered thin film structure at least including a light generation layer (LGL). For example, the light emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron transport layer (EIL) for injecting electrons.

The color of light generated in the LGL may be one of red, green, blue, and white, but the present disclosure is not limited thereto. For example, the color of light generated in the LGL of the light emitting layer EML may also be one of magenta, cyan, and yellow.

The HIL, the HTL, the HBL, the ETL, and the EIL may be common layers connected in light emitting regions adjacent to each other.

The second electrode CD may be a semi-transmissive reflective layer. For example, the second electrode CD may be a thin metal layer having a thickness, through which light emitted through the light emitting layer EML can be transmitted. The second electrode CD may transmit a portion of the light emitted from the light emitting layer EML therethrough, and may reflect the rest of the light emitted from the light emitting layer EML.

The second electrode CD may include a material having a lower work function than the transparent conductive layer. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), alloys thereof, and/or the like.

A portion of the light emitted from the light emitting layer EML may not be transmitted through the second electrode CD, and the light reflected from the second electrode CD may be again reflected from the reflective layer. That is, the light emitted from the light emitting layer EML may resonate between the reflective layer and the second electrode CD. The light extraction efficiency of the light emitting device OLED can be improved by the resonance of the light.

The distance between the reflective layer and the second electrode CD may be changed depending on a color of the light emitted from the light emitting layer EML. That is, the distance between the reflective layer and the second electrode CD may be adjusted to correspond to a resonance distance, depending on a color of the light emitted from the light emitting layer EML.

The sealing layer SLM can reduce or prevent infiltration of oxygen and moisture into the light emitting device OLED. The sealing layer SLM may include a plurality of inorganic layers and a plurality of organic layers. For example, the sealing layer SLM may include a plurality of sealing layers including the inorganic layer and the organic layer disposed on the inorganic layer. In addition, the inorganic layer may be disposed at the uppermost portion of the sealing layer SLM. The inorganic layer may include at least one of silicon oxide, silicon nitride, silicon oxynitride, aluminum oxide, titanium oxide, zirconium oxide, tin oxide, and/or the like.

In an embodiment, the second pixel PXL2 provided in the second pixel region PXA2 and the third pixel PXL3 provided in the third pixel region PXA3 have substantially the same pixel structure as the first pixel PXL1, and therefore, their descriptions may not be repeated.

Figure 15:
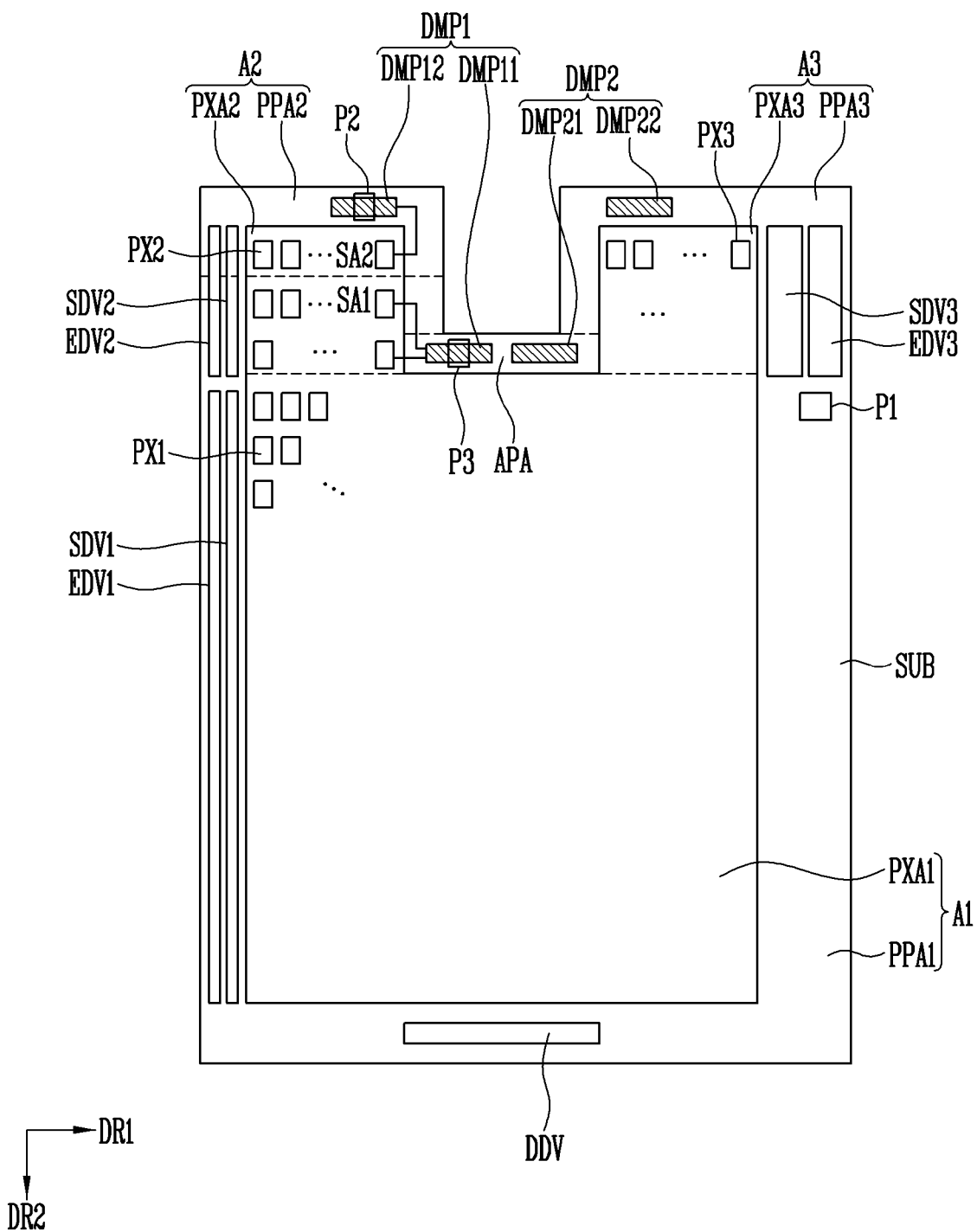
FIGS. 15-16 illustrate display devices according to embodiments of the present disclosure, which are plan views illustrating the display devices, each having a dummy unit disposed in a peripheral region.
Figure 16:
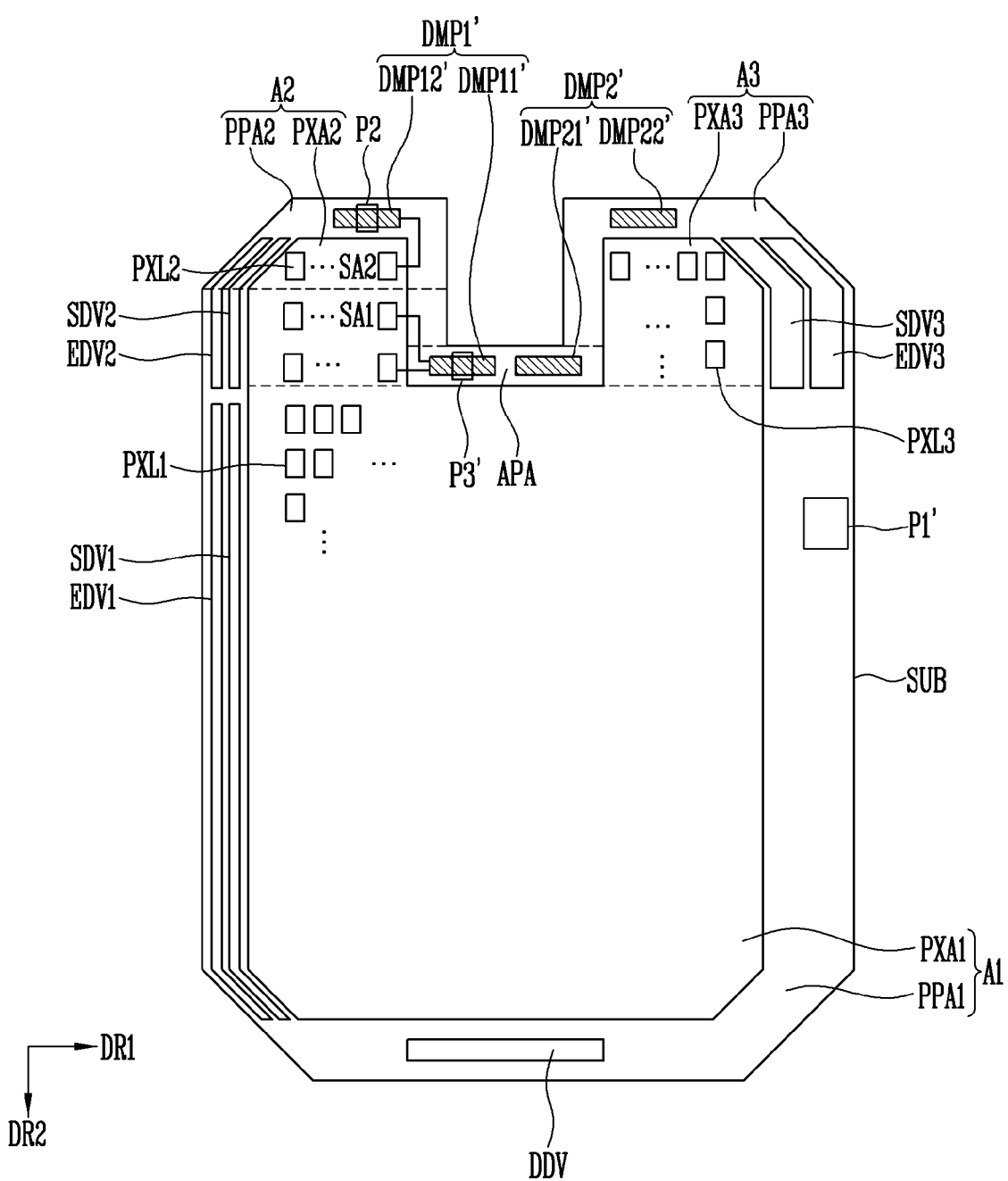
Figure 17:
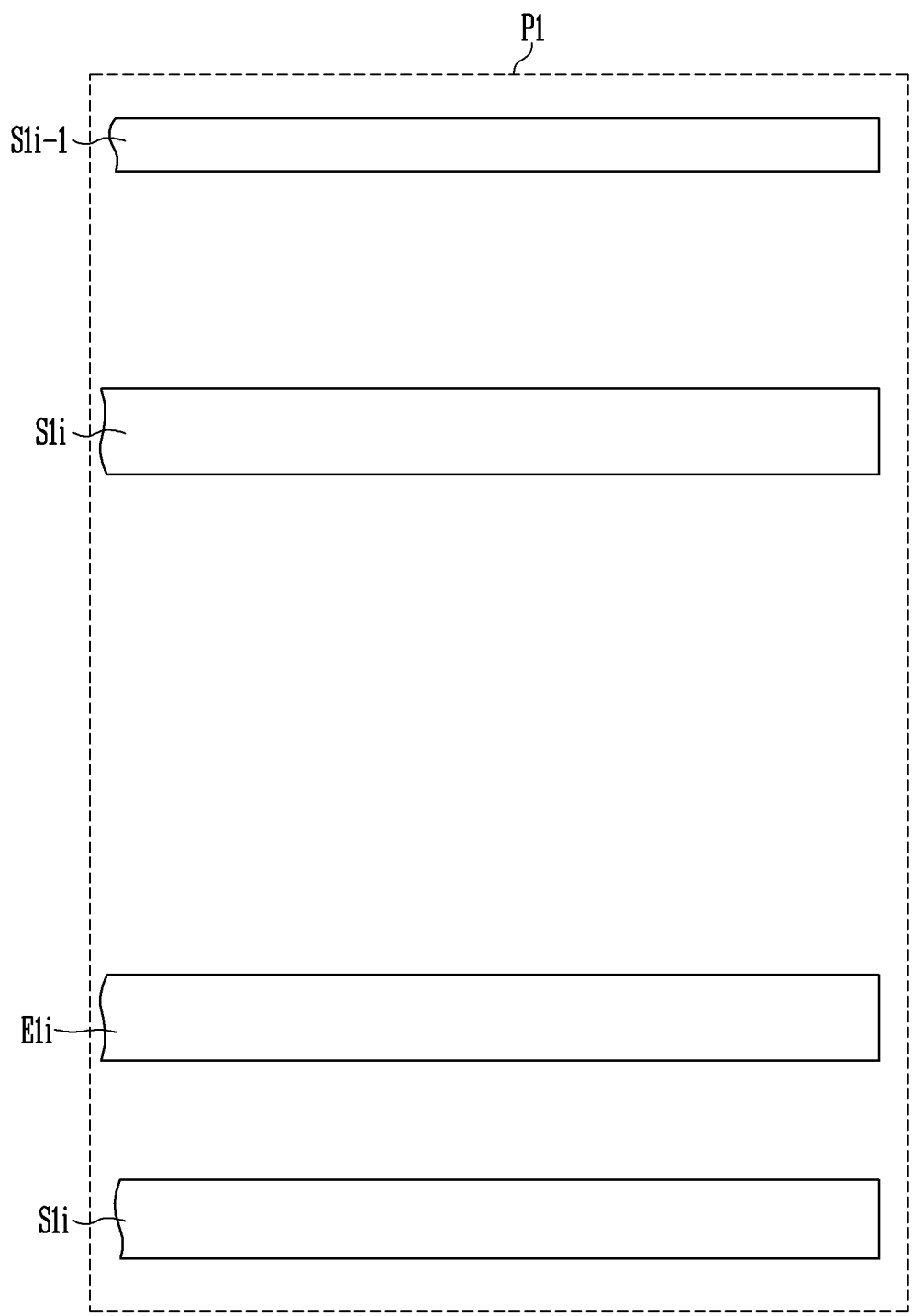
FIG. 17 is a plan view illustrating a portion corresponding to P1 of FIG. 15.
Figure 18:
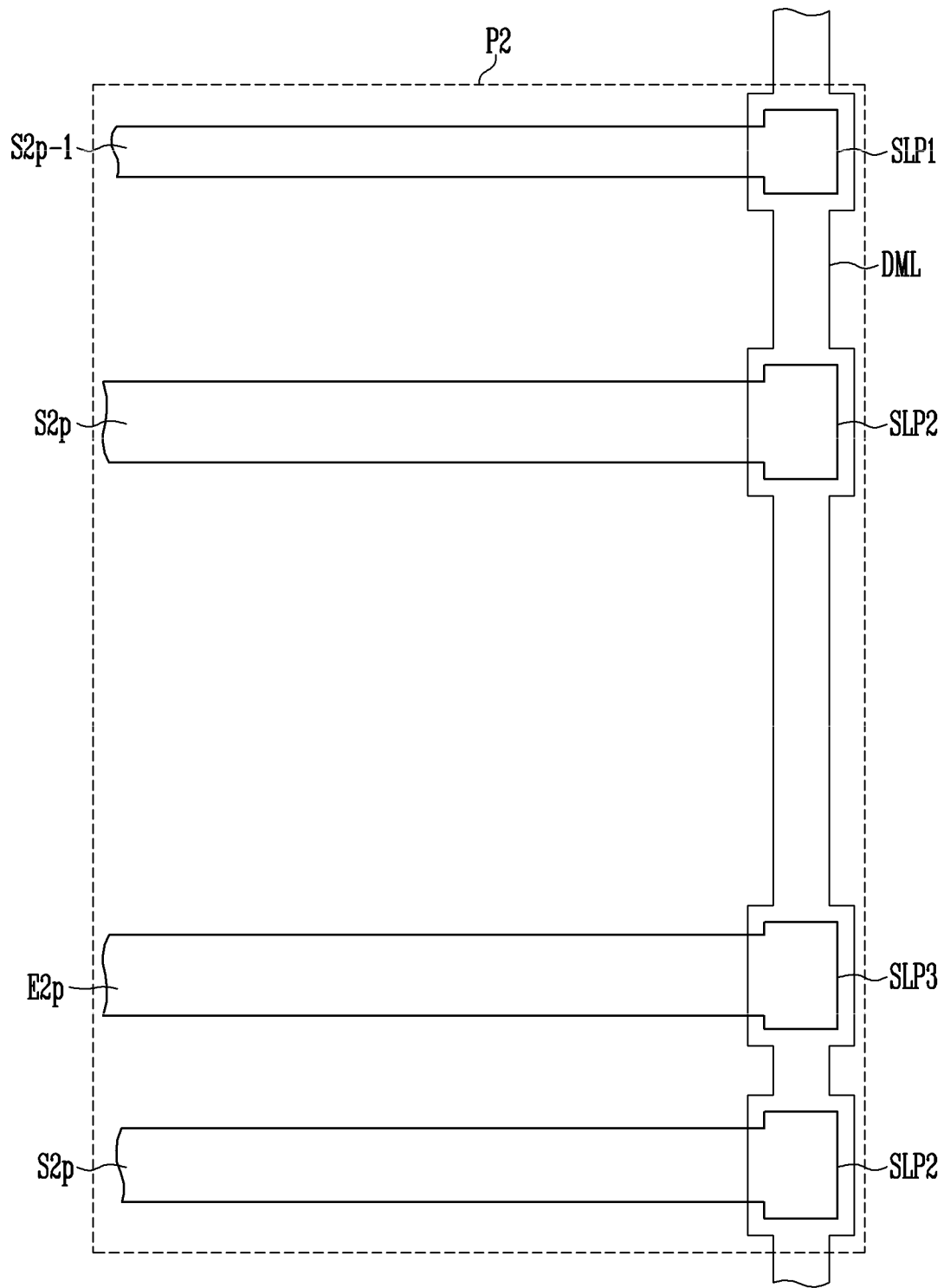
FIG. 18 is a plan view illustrating a portion corresponding to P2 of FIG. 15.
Figure 19:
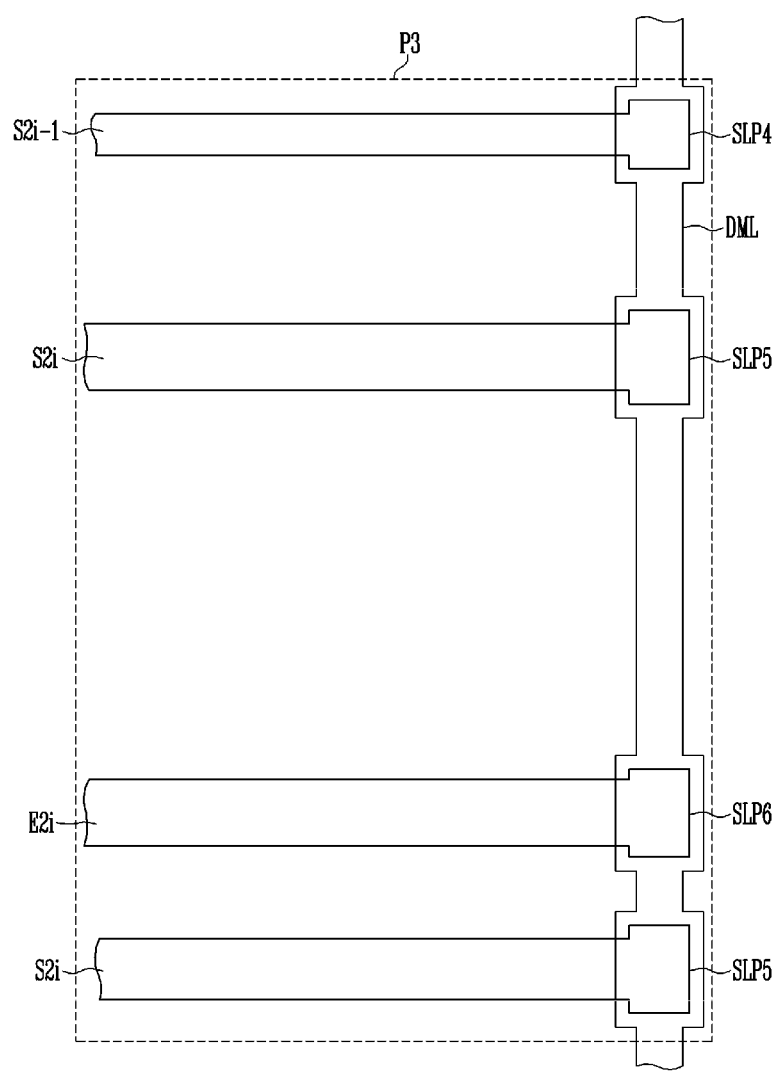
FIG. 19 is a plan view illustrating a portion corresponding to P3 of FIG. 15.
Figure 20:
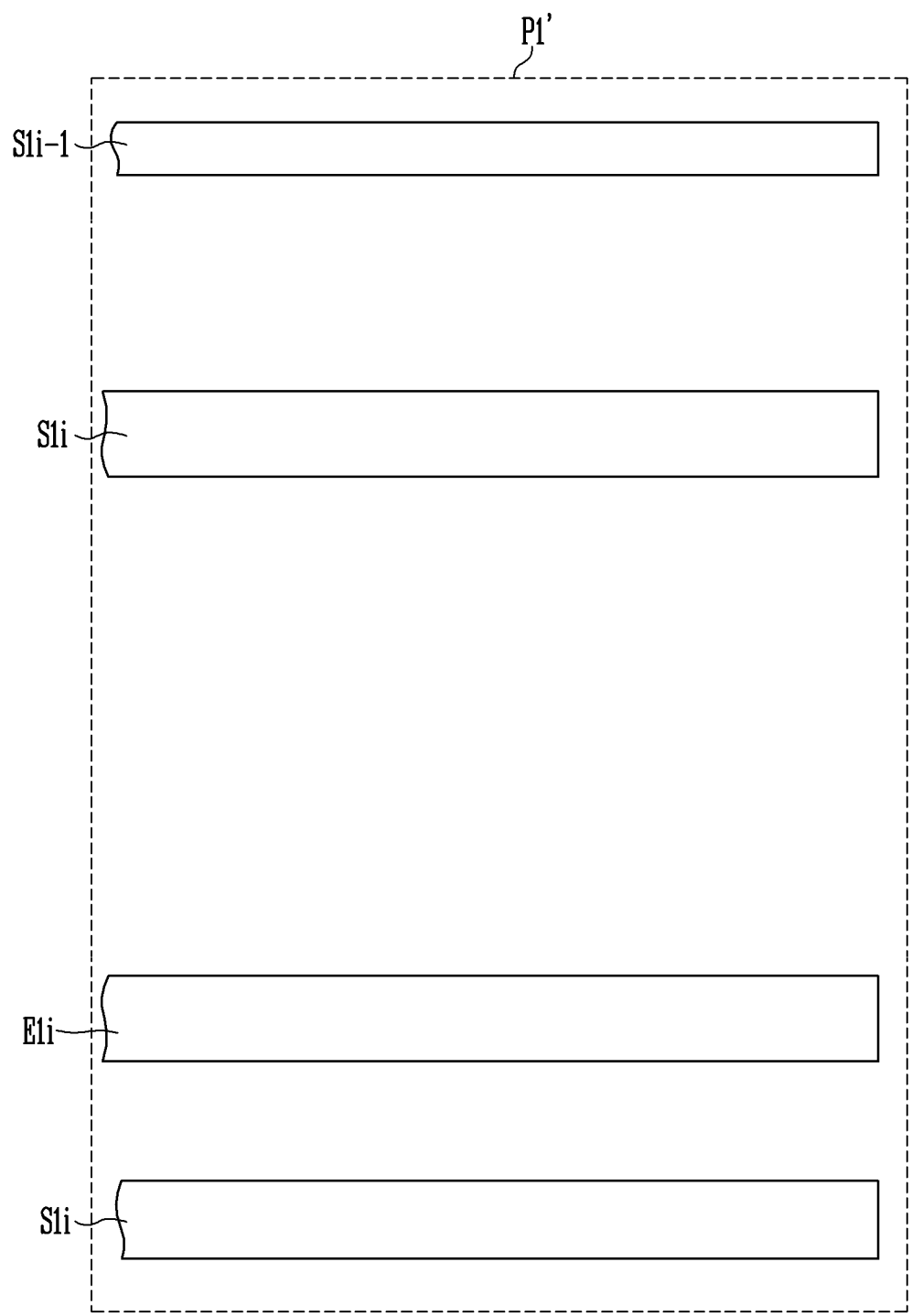
FIG. 20 is a plan view illustrating a portion corresponding to P1' of FIG. 16.
Figure 21:
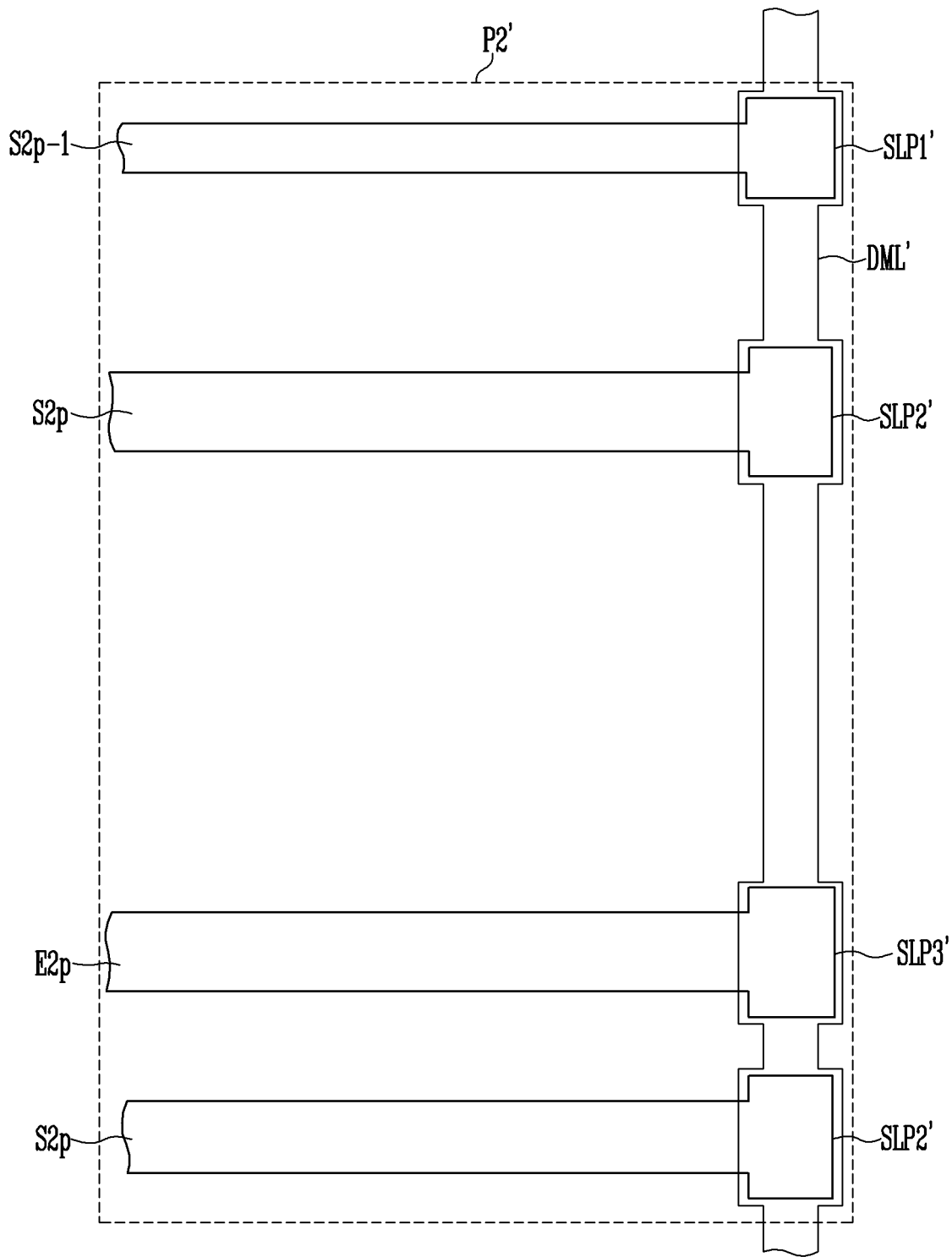
FIG. 21 is a plan view illustrating a portion corresponding to P2' of FIG. 16.
Figure 22:
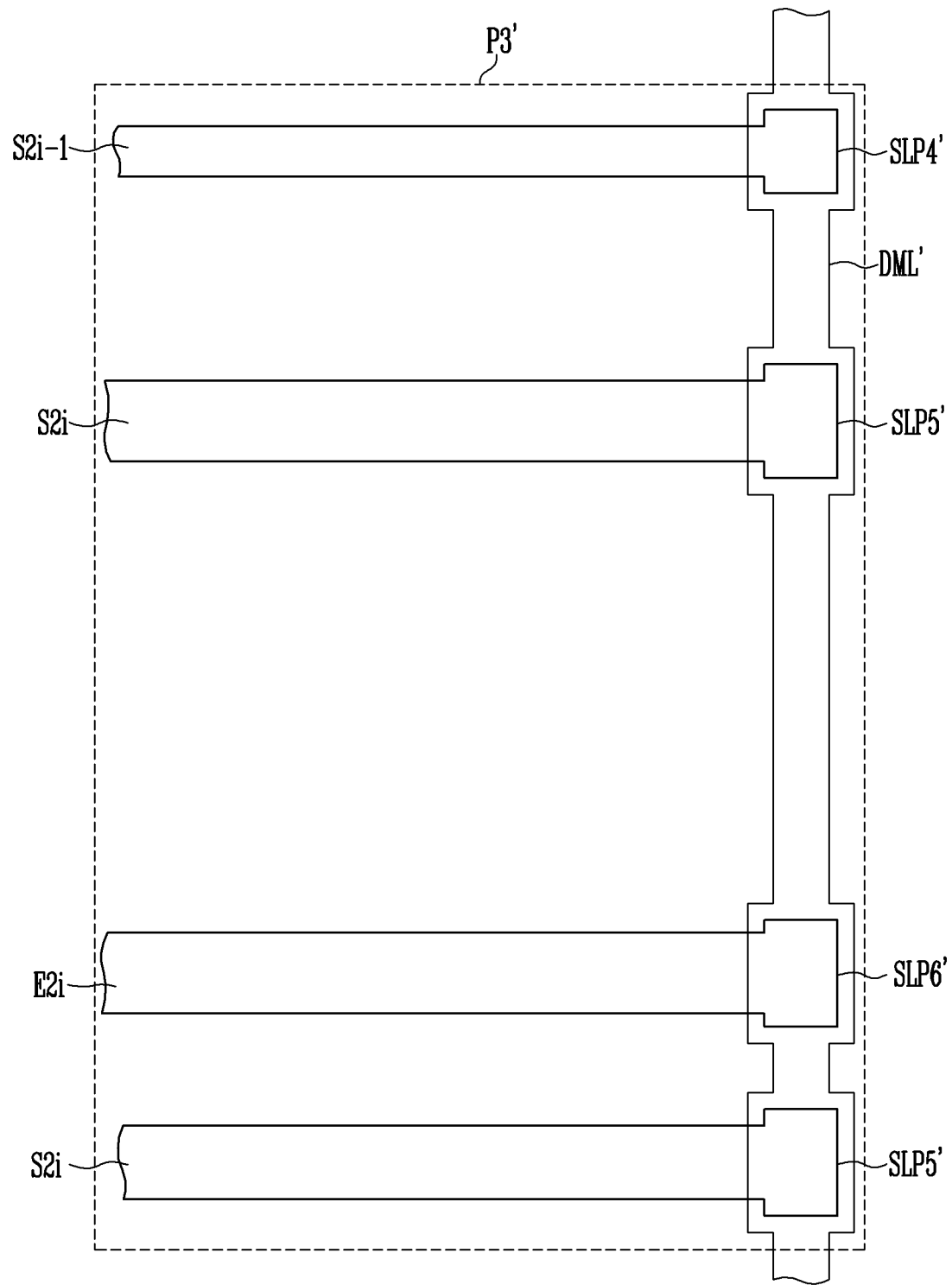
FIG. 22 is a plan view illustrating a portion corresponding to P3' of FIG. 16.

FIGS. 15 and 16 illustrate display devices according to embodiments of the present disclosure, which are plan views illustrating the display devices each having a dummy unit DMP1 or DMP2 disposed in a peripheral region PPA. FIG. 17 is a plan view illustrating a portion corresponding to P1 of FIG. 15. FIG. 18 is a plan view illustrating a portion corresponding to P2 of FIG. 15. FIG. 19 is a plan view illustrating a portion corresponding to P3 of FIG. 15. FIG. 20 is a plan view illustrating a portion corresponding to P1' of FIG. 16. FIG. 21 is a plan view illustrating a portion corresponding to P2' of FIG. 16. FIG. 22 is a plan view illustrating a portion corresponding to P3' of FIG. 16. For convenience of description, scan lines and light emitting control lines corresponding to one pixel are illustrated in FIGS. 15 to 22.

Referring to FIGS. 15 to 22, in order to compensate for a difference in load value for each pixel region, a dummy unit DMP1, DMP2, DMP1', or DMP2' is provided (e.g., is at) or is not provided to (e.g., is not at or is outside of) a peripheral region corresponding to each pixel region, so that structures having different parasitic capacitances are employed. That is, in order to compensate for a difference in load value between scan lines in a first pixel region PXA1 and a second pixel region PXA2, the dummy unit DMP1, DMP2, DMP1', or DMP2' is not provided to a first peripheral region PPA1 corresponding to the first pixel region PXA1, and the dummy unit DMP1 may be provided in a second peripheral region PPA2 corresponding to the second pixel region PXA2 and an additional peripheral region APA.

In an embodiment, end portions of first scan lines S1$i$-1 and S1$i$ and a first light emitting control line E1$i$ may be provided in the first peripheral region PPA1, and end portions of second scan lines S2$i$-1, S2$i$, S2$p$-1, and S2$p$ (p being a natural number different from i) and second light emitting control lines E2$i$ and E2$p$ may be provided to the second peripheral region PPA2 or the additional peripheral region APA. The dummy unit DMP1 or DMP1' is not provided to the end portions of the first scan lines S1$i$-1 and S1$i$ and the first light emitting control line E1$i$, and may be provided to a region corresponding to the end portions of the second scan lines S2$i$-1, S2$i$, S2$p$-1, and S2$p$ and the second light emitting control lines E2$i$ and E2$p$.

The dummy unit DMP1 or DMP1' may include at least two sub-dummy units DMP11 or DMP11' and DMP12 or DMP12'. For example, the dummy unit DMP1 or DMP1' may include a first sub-dummy unit DMP11 or DMP11' and a second sub-dummy unit DMP12 or DMP12'. The first sub-dummy unit DMP11 or DMP11' may compensate for load values of one of a first sub-region SA1 and a second sub-region SA2 of the second pixel region PXA2, for example, the second scan lines S2$i$-1 and S2$i$ and the second light emitting control line E2$i$. The second sub-dummy unit DMP12 or DMP12' may compensate for load values of the other of the first sub-region SA1 and the second sub-region SA2 of the second pixel region PXA2, for example, the second scan lines S2$p$-1 and S2$p$ and the second light emitting control line E2$p$.

The first sub-dummy unit DMP11 or DMP11' and the second sub-dummy unit DMP12 or DMP12' may be disposed to be spaced apart from each other. For example, the first sub-dummy unit DMP11 or DMP11' may be disposed at a portion of the additional peripheral region APA adjacent to the first sub-region SA1, and the second sub-dummy unit DMP12 or DMP12' may be disposed at a portion of the second peripheral region PPA2 adjacent to the second sub-region SA2. Because the first sub-dummy unit DMP11 or DMP11' and the second sub-dummy unit DMP12 or DMP12' are disposed to be spaced apart from each other, the width of the second peripheral region PPA2 may be decreased.

The dummy unit DMP1 or DMP1' may overlap with the second scan lines S2$i$-1, S2$i$, S2$p$-1, and S2$p$ and the second light emitting control lines E2$i$ and E2$p$. For example, the first sub-dummy unit DMP11 or DMP11' and the second sub-dummy unit DMP12 or DMP12' may include a dummy line DML or DML' overlapping with the end portions of the second scan lines S2$i$-1, S2$i$, S2$p$-1, and S2$p$ and the second light emitting control lines E2$i$ and E2$p$. That is, the dummy line DML or DML' may be provided to the second peripheral region PPA2 and the additional peripheral region APA. In addition, a fixed voltage may be applied to the dummy line DML or DML'. Therefore, the dummy line DML or DML' may overlap with the second scan lines S2$i$-1, S2$i$, S2$p$-1, and S2$p$ and the second light emitting control lines E2$i$ and E2$p$, thereby forming a parasitic capacitor.

The voltage applied to the dummy line DML or DML' has a fixed level (e.g., a fixed predetermined level), and is not particularly limited. For example, the fixed voltage applied to the dummy line DML or DML' may be one of a first power source ELVDD, a second power source ELVSS, and a high gate-on voltage Vgh.

The dummy line DML or DML' overlaps with the second scan lines S2$i$-1, S2$i$, S2$p$-1, and S2$p$ and the second light emitting control lines E2$i$ and E2$p$, thereby forming a parasitic capacitor, and the forming position or material of the dummy line DML or DML' is not particularly limited. In an embodiment, the dummy line DML or DML' may be formed of the same or substantially the same material as a power line using the same process. Therefore, the dummy line DML or DML' may be formed in the same layer as the power line, and may include the same or substantially the same material as the power line. The dummy line DML or DML' overlaps with the second scan lines S2$i$-1, S2$i$, S2$p$-1, and S2$p$ and the second light emitting control lines E2$i$ and E2$p$, so that a parasitic capacitor may be formed between the dummy line DML or DML' and the second scan lines S2$i$-1, S2$i$, S2$p$-1, and S2$p$ and between the dummy line DML or DML' and the second light emitting control lines E2$i$ and E2$p$.

The parasitic capacitance of the parasitic capacitor may be changed depending on overlapping areas of the dummy line DML or DML' with the second scan lines S2$i$-1, S2$i$, S2$p$-1, and S2$p$ and the second light emitting control lines E2$i$ and E2$p$. Therefore, in order to increase the parasitic capacitance, an (i-1)th second scan line pads SLP1 or SLP1', an ith second scan line pad SLP2 or SLP2', an ith second light emitting control line pad SLP3 or SLP3', a (p-1)th (p≠i) second scan line pad SLP4 or SLP4', a pth second scan line pad SLP5 or SLP5', and a pth second light emitting control line pad SLP6 or SLP6' may be provided to the respective end portions of the second scan lines S2$i$-1, S2$i$, S2$p$-1, and S2$p$ and the second light emitting control lines E2$i$ and E2$p$.

The (i-1)th second scan line pads SLP1 or SLP1', the ith second scan line pad SLP2 or SLP2', and the ith second light emitting control line pad SLP3 or SLP3' may have greater widths than the (i-1)th second scan line S2$i$-1, the ith second scan line S2$i$, and the ith second light emitting control line E2$i$, respectively, and accordingly, the overlapping area with the dummy line DML or DML' can be increased. In addition, the (p−1)th second scan line pad SLP4 or SLP4', the pth second scan line pad SLP5 or SLP5', and the pth second light emitting control line pad SLP6 or SLP6' have greater widths than the (p−1)th second scan line S2$p$−1, the pth second scan line S2$p$, and the pth second light emitting control line E2$p$, respectively, and accordingly, the overlapping area with the dummy line DML or DML' can be increased.

Here, the dummy line DML or DML' may also be widely formed to cover the (i−1)th second scan line pads SLP1 or SLP1', the ith second scan line pad SLP2 or SLP2', the ith second light emitting control line pad SLP3 or SLP3', the (p−1)th second scan line pad SLP4 or SLP4', the pth second scan line pad SLP5 or SLP5', and the pth second light emitting control line pad SLP6 or SLP6'.

Accordingly, a load caused by a parasitic capacitor additionally generated by the dummy unit DMP provided to the second peripheral region PPA2 is increased in the second scan lines S2$i$−1, S2$i$, S2$p$−1, and S2$p$ and the second light emitting control lines E2$i$ and E2$p$, and the load value of the second scan lines S2$i$−1, S2$i$, S2$p$−1, and S2$p$ and the second light emitting control lines E2$i$ and E2$p$ of the second pixel region PXA2 is compensated. As a result, the load value of the second scan lines S2$i$−1, S2$i$, S2$p$−1, and S2$p$ and the second light emitting control lines E2$i$ and E2$p$ may be equal or similar to that of the first scan lines S1$i$−1 and S1$i$ and the second light emitting control line E1$i$.

For convenience of illustration, these embodiments have been described using a first pixel PXL1 on an ith row of the first pixel region PXA1, a second pixel PXL2 on the ith row of the second pixel region PXA2, and a second pixel PXL2 on a pth row of the second pixel region PXA2, but the present disclosure is not limited thereto. For example, the overlapping area of the dummy unit with second scan lines and a second light emitting line, which are connected to a second pixel PXL2 on a kth (k≠i and k≠p) row of the second pixel region PXA2 and a second pixel PXL2 on an hth (h≠i, h≠p, and h≠k) row of the second pixel region PXA2 may be changed, thereby forming a parasitic capacitance.

In an embodiment, when the lengths of the second scan lines and the second light emitting control lines of the second pixel region PXA2 are all the same, the load values compensated by the dummy unit DMP1 and DMP1' may be the same. That is, as shown in FIGS. 15, 18, and 19, the parasitic capacitances of parasitic capacitors formed in the first sub-dummy unit DMP11 or DMP11' and the second sub-dummy unit DMP12 or DMP12' may be the same.

In addition, when the lengths of the second scan lines and the second light emitting control lines of the second pixel region PXA2 are different from each other, the load values compensated by the dummy unit DMP1 and DMP1' may be different from each other. That is, as shown in FIGS. 21 and 22, the parasitic capacitances of parasitic capacitors formed in the first sub-dummy unit DMP11' and the second sub-dummy unit DMP12' may be different from each other. For example, if the lengths of the second scan lines and the second light emitting control lines of the first sub-region SA1 are longer than those of the second scan lines and the second light emitting control lines of the second sub-region SA2, the parasitic capacitance of the parasitic capacitor formed in the first sub-dummy unit DMP11' may be smaller than that of the parasitic capacitor formed in the second sub-dummy unit DMP12'.

In an embodiment, in order to compensate for a difference in load value between the scan lines and the light emitting control lines in the first pixel region PXA1 and scan lines and light emitting control lines in a third pixel region PXA3, any dummy unit is not provided to the first peripheral region PPA1 corresponding to the first pixel region PXA1, and the dummy unit DMP2 or DMP2' may be provided to a third peripheral region PPA3 corresponding to the third pixel region PXA3 and the additional peripheral region APA.

The dummy unit DMP2 or DMP2' may include a third sub-dummy unit DMP21 or DMP21' and a fourth sub-dummy unit DMP22 or DMP22'. The third sub-dummy unit DMP21 or DMP21' may compensate for load values of one of a first sub-region SA1 and a second sub-region SA2 of the third pixel region PXA3, for example, third scan lines and third light emitting control lines of the first sub-region SA1. The fourth sub-dummy unit DMP22 or DMP22' may compensate for load values of the other of the first sub-region SA1 and the second sub-region SA2, for example, the third scan lines and the third light emitting control lines of the second sub-region SA2.

The third sub-dummy unit DMP21 or DMP21' and the fourth sub-dummy unit DMP22 or DMP22' may be disposed to be spaced apart from each other. For example, the third sub-dummy unit DMP21 or DMP21' may be disposed at a portion of the additional peripheral region APA adjacent to the first sub-region SA1. The fourth sub-dummy unit DMP22 or DMP22' may be disposed at a portion of the third peripheral region PPA3 adjacent to the second sub-region SA2. Because the third sub-dummy unit DMP21 or DMP21' and the fourth sub-dummy unit DMP22 or DMP22' are disposed to be spaced apart from each other, the width of the third peripheral region PPA3 can be decreased.

Here, the load values compensated by the third sub-dummy unit DMP21 or DMP21' and the fourth sub-dummy unit DMP22 or DMP22' may be equal to those compensated by the first sub-dummy unit DMP11 or DMP11' and the second sub-dummy unit DMP12 or DMP12'.

In addition, when the lengths of the third scan lines and the third light emitting control lines of the third pixel region PXA3 are different from each other, the load values compensated by the third sub-dummy unit DMP21 or DMP21' and the fourth sub-dummy unit DMP22 or DMP22' may be different from each other.

In an embodiment, the end portions of the first scan lines S1$i$−1 and S1$i$ and the first light emitting control line E1$i$ may extend up to the first peripheral region PPA1 as described above, but the present disclosure is not limited thereto. For example, unlike the end portions of the second scan lines S2$i$−1, S2$i$, S2$p$−1, and S2$p$, the second light emitting control line E2$i$, the third scan lines, and the third light emitting control lines, it is unnecessary to form any parasitic capacitor in the first scan lines S1$i$−1 and S1$i$, and therefore, the end portions of the first scan lines S1$i$−1 and S1$i$ and the first light emitting control line E1$i$ may not be provided to the first peripheral region PPA1.

In the embodiments of the present disclosure, each dummy unit is implemented in a form in which it forms a parasitic capacitor in two scan lines provided to each pixel, but the number of scan lines is not limited thereto. It will be apparent that the number of scan lines provided to the dummy unit may be changed depending on structures of pixels implemented in display devices.

Also, in the embodiments of the present disclosure, each dummy unit is implemented in a form in which the dummy line DML overlaps with the scan lines, thereby forming a parasitic capacitance, but the present disclosure is not limited thereto. For example, each dummy unit may be implemented as the first power supply line ELVDD or the second power supply line ELVSS overlapping with the scan lines.

As described above, each of the display devices according to the embodiments of the present disclosure includes the dummy unit DMP1 or DMP1' and DMP2 or DMP2', so that it is possible to compensate for a difference in load value between scan lines or light emitting control lines in each region. Thus, the display device can entirely express a uniform image. In addition, each of the dummy unit DMP1 or DMP1' and DMP2 or DMP2' is divided into a plurality of dummy units, so that it is possible to decrease the width of the peripheral regions in the display device.

Figure 23:
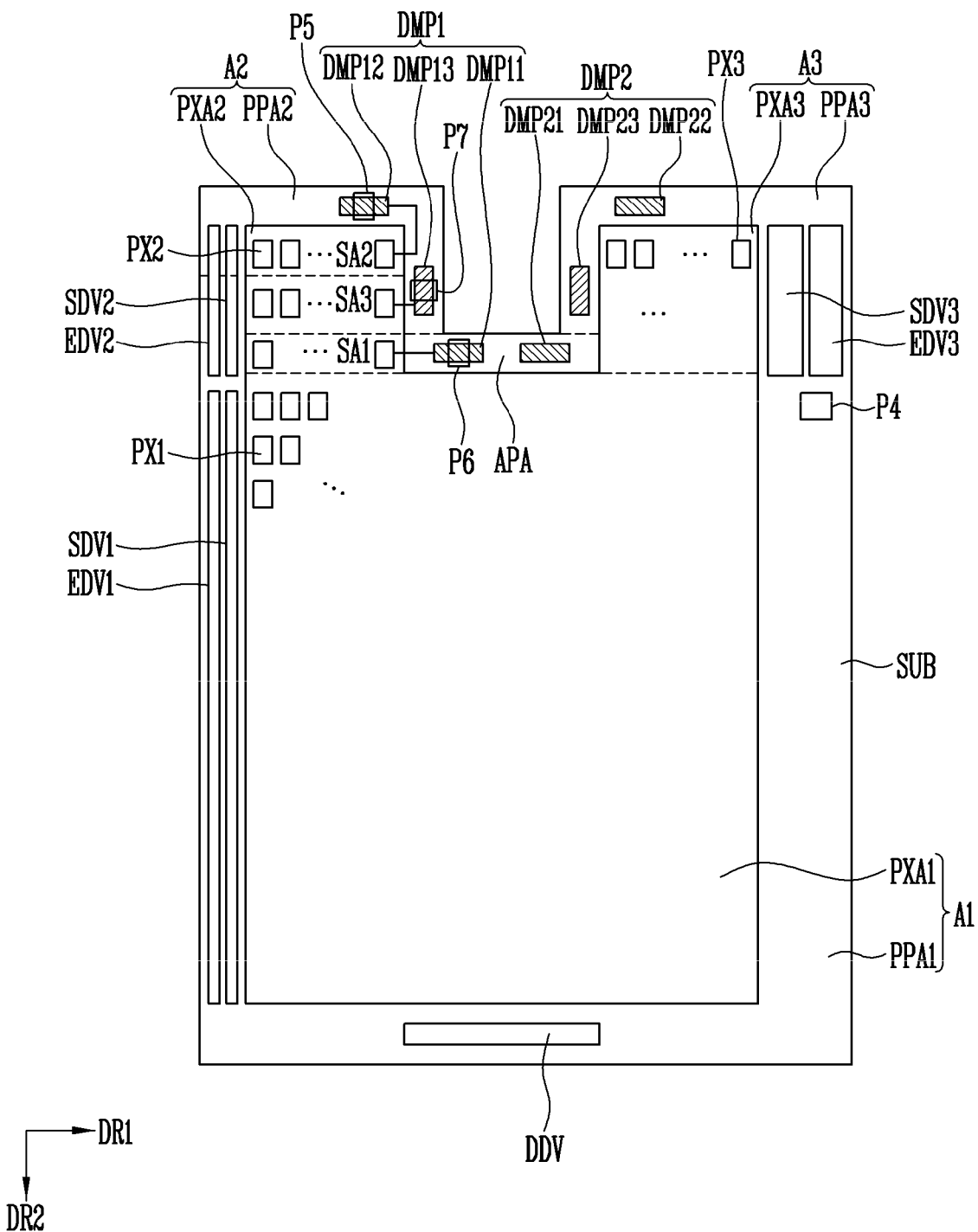
FIGS. 23-24 illustrate display devices according to embodiments of the present disclosure, which are plan views illustrating the display devices, each having a dummy unit disposed in a peripheral region.
Figure 24:
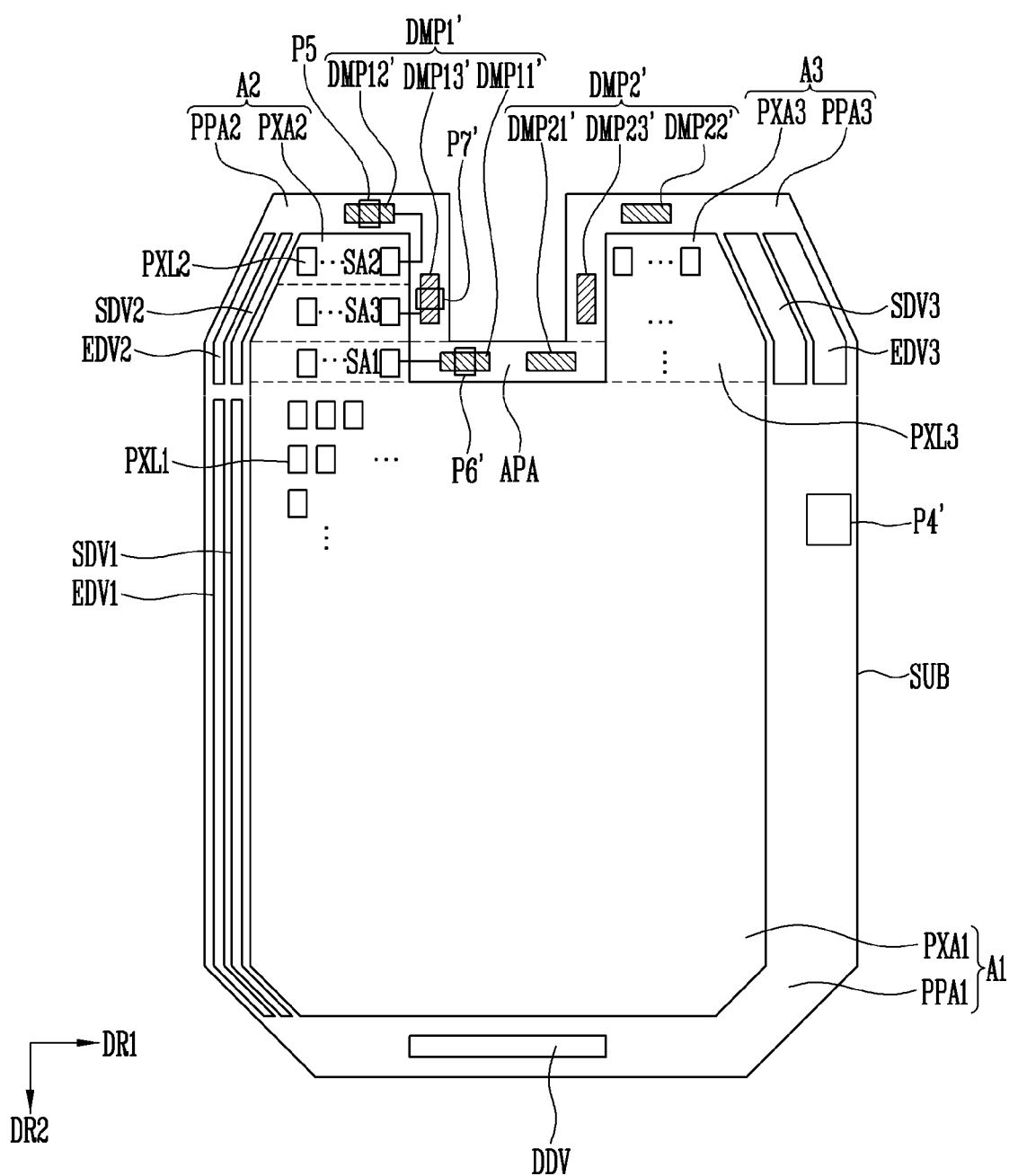
Figure 25:
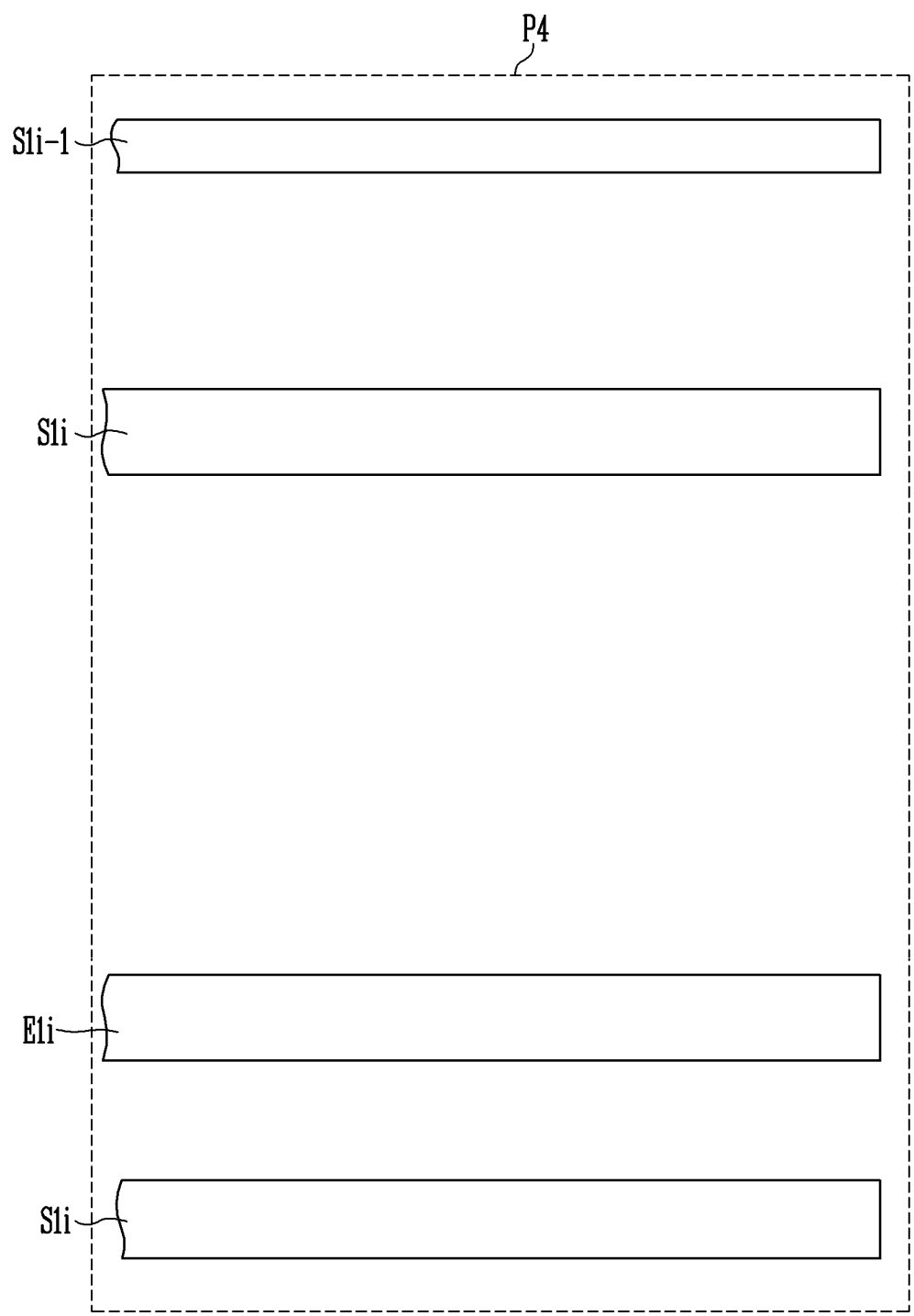
FIG. 25 is a plan view illustrating a portion corresponding to P4 of FIG. 23.
Figure 26:
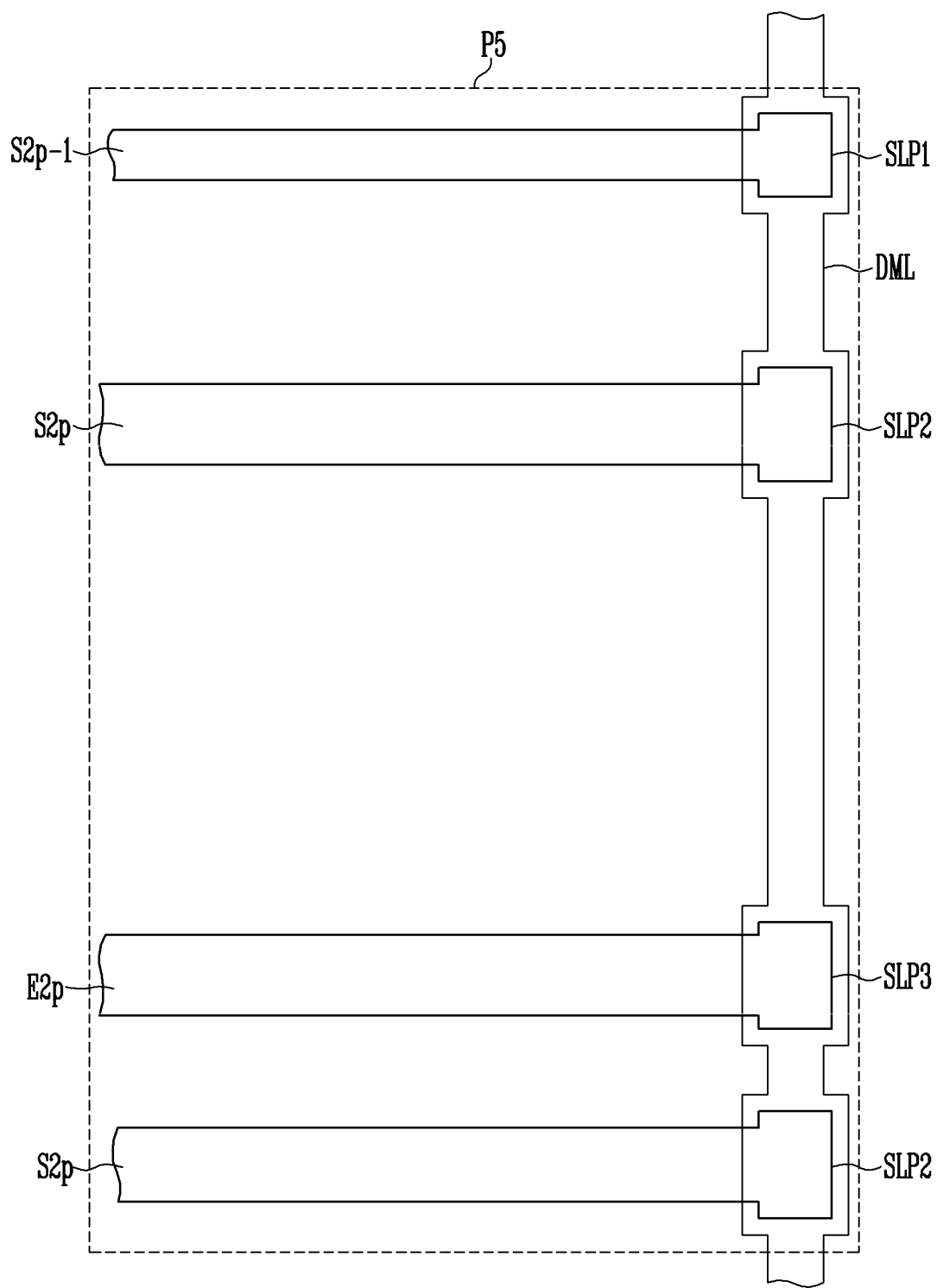
FIG. 26 is a plan view illustrating a portion corresponding to P5 of FIG. 23.
Figure 27:
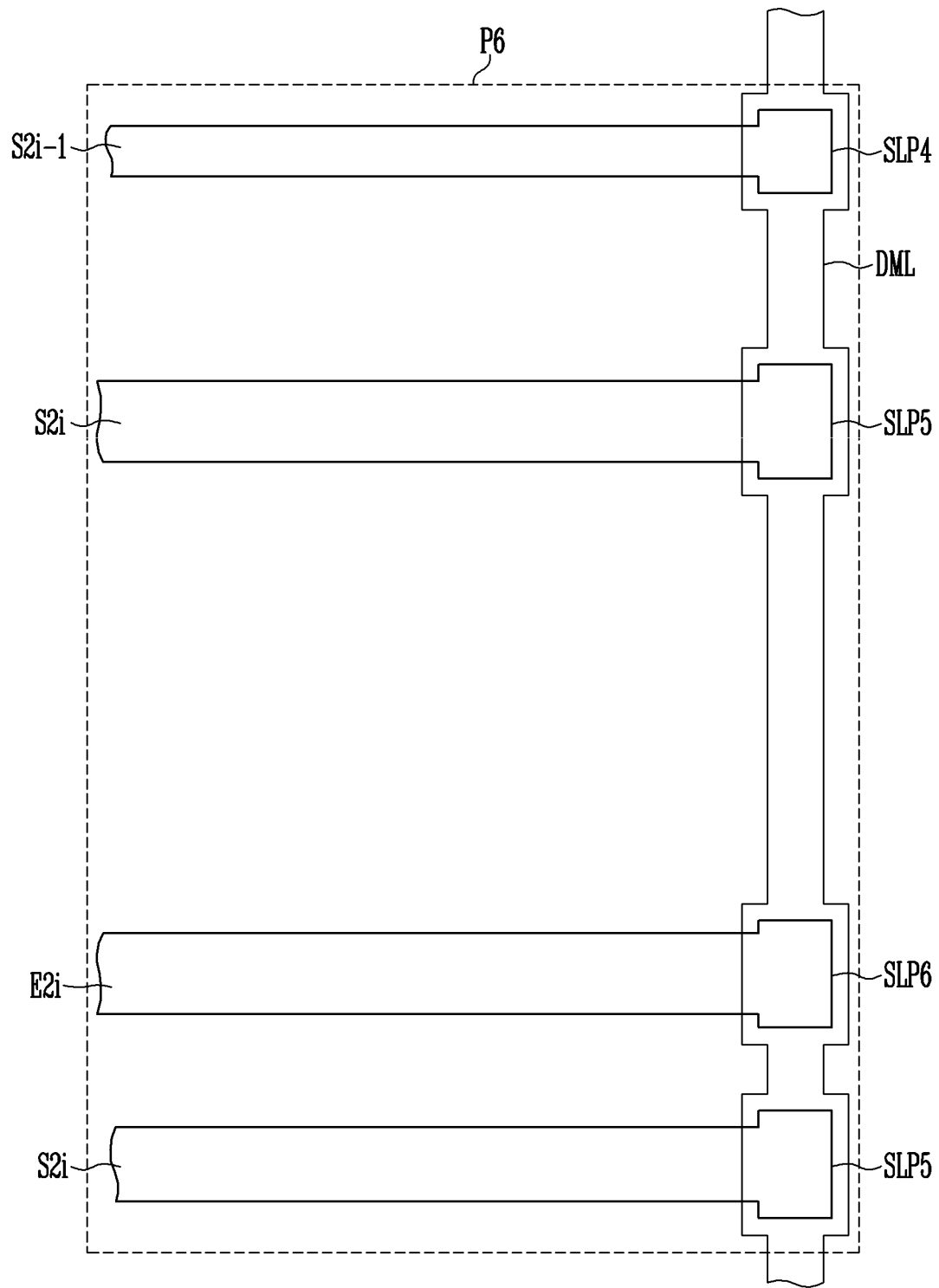
FIG. 27 is a plan view illustrating a portion corresponding to P6 of FIG. 23.
Figure 28:
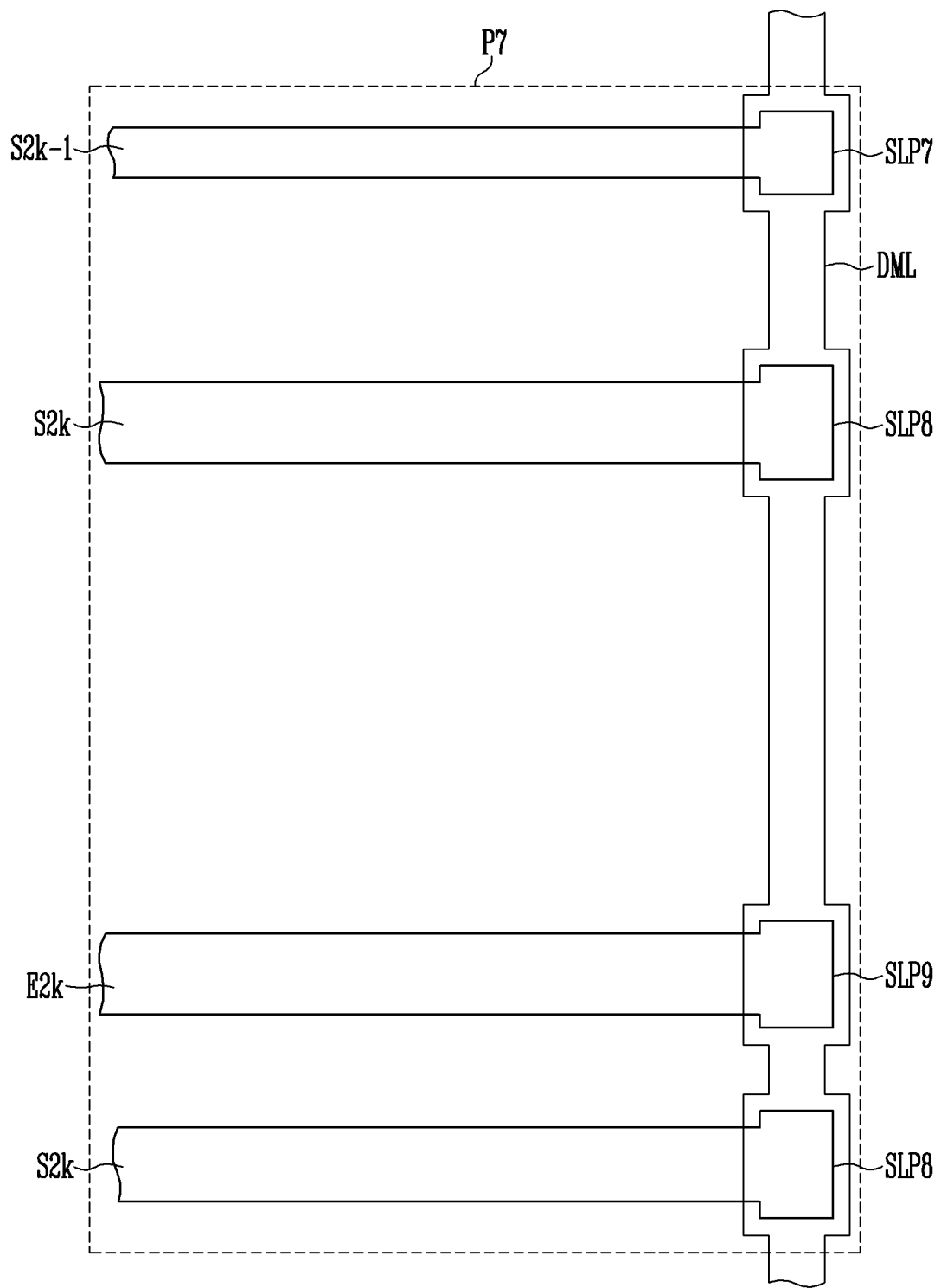
FIG. 28 is a plan view illustrating a portion corresponding to P7 of FIG. 23.
Figure 29:
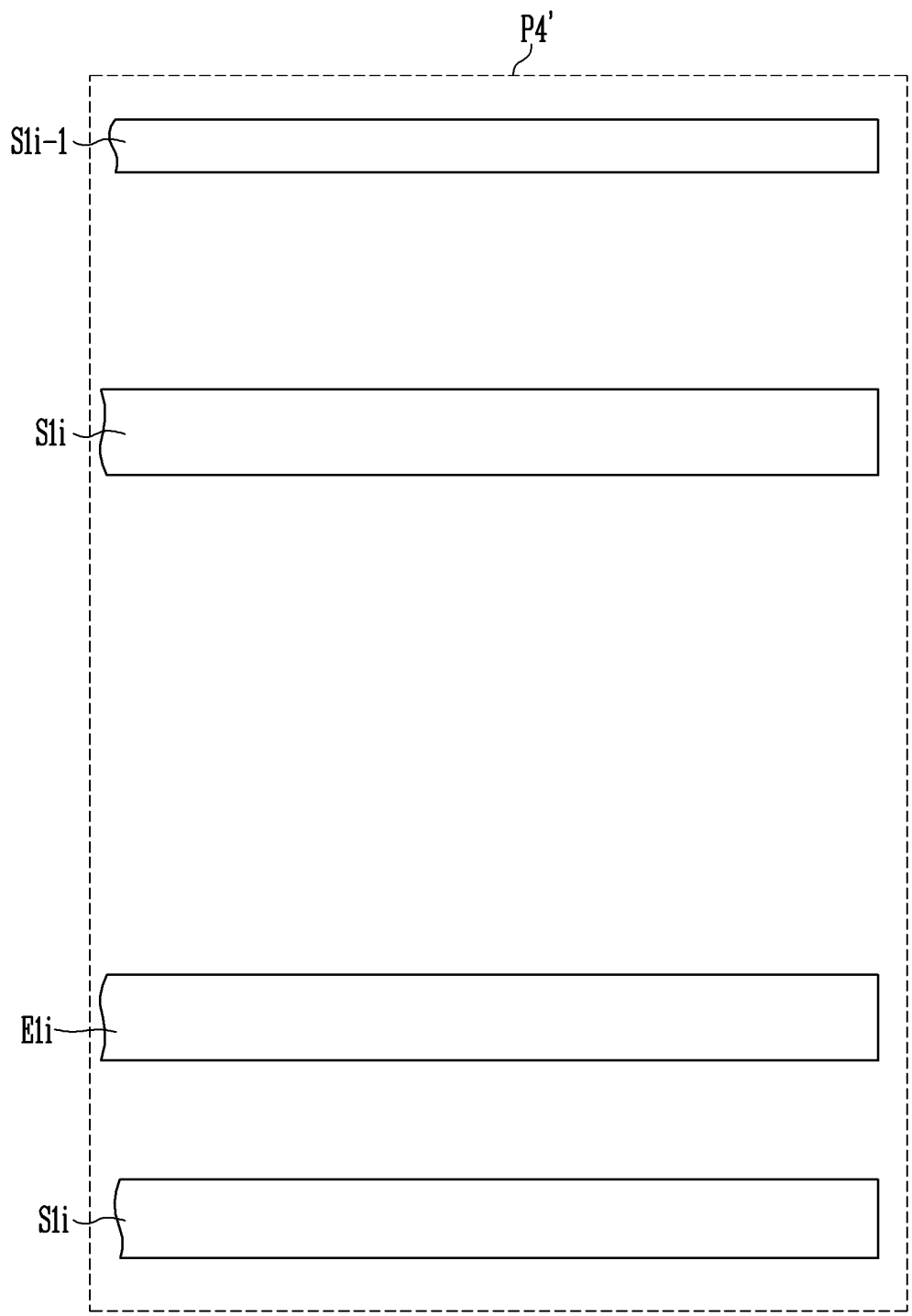
FIG. 29 is a plan view illustrating a portion corresponding to P4' of FIG. 24.
Figure 30:
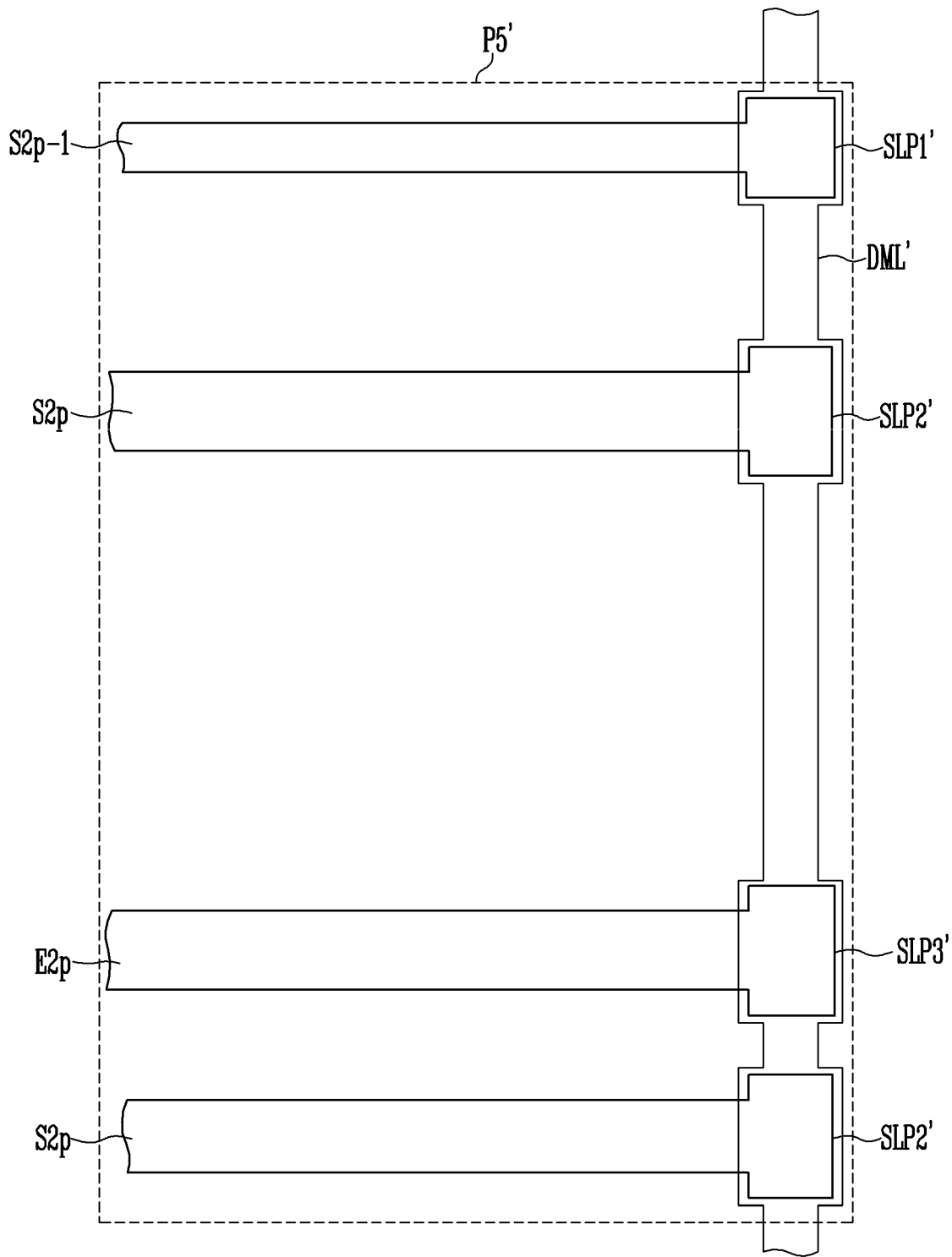
FIG. 30 is a plan view illustrating a portion corresponding to P5' of FIG. 24.
Figure 31:
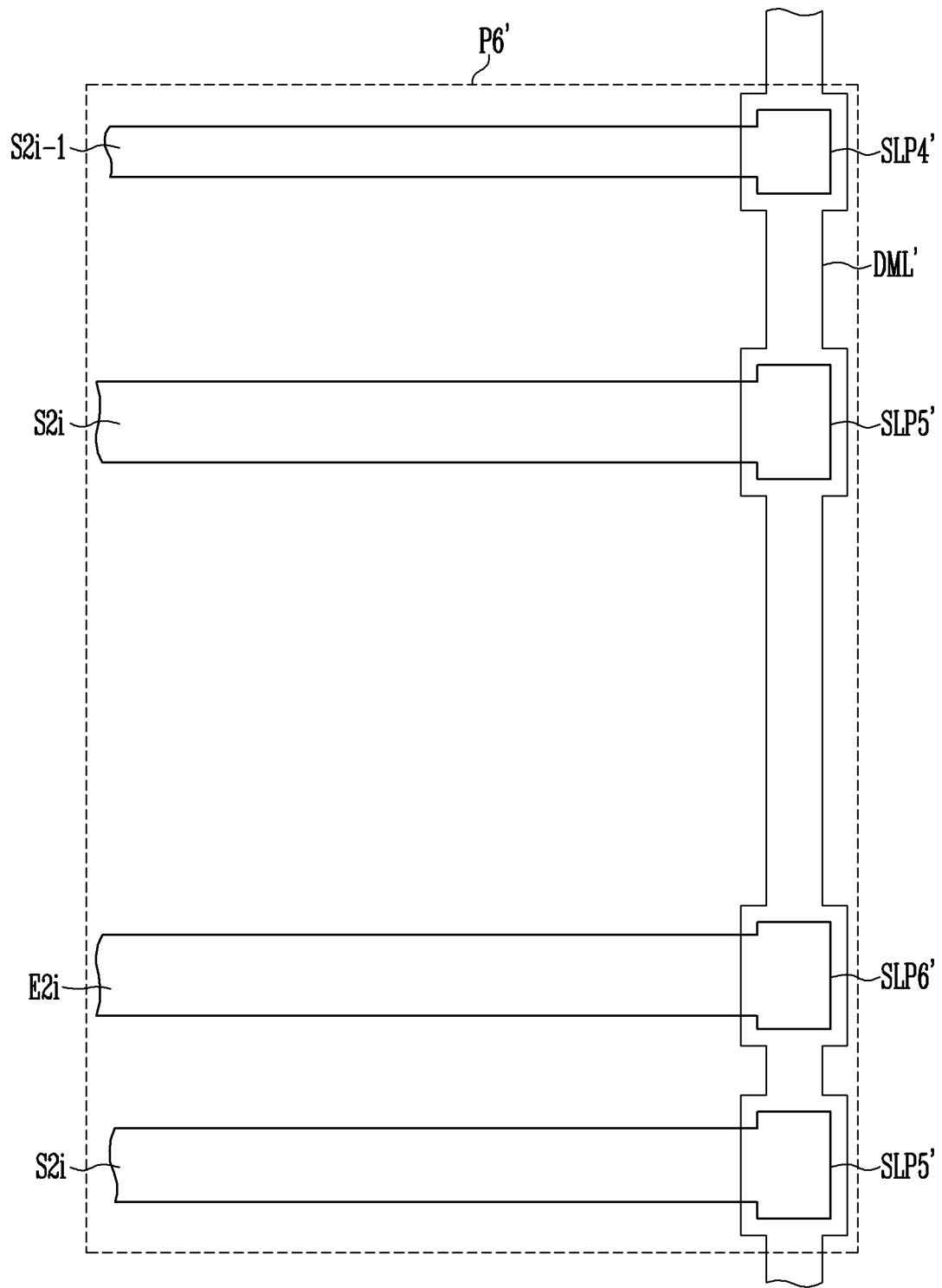
FIG. 31 is a plan view illustrating a portion corresponding to P6' of FIG. 24.
Figure 32:
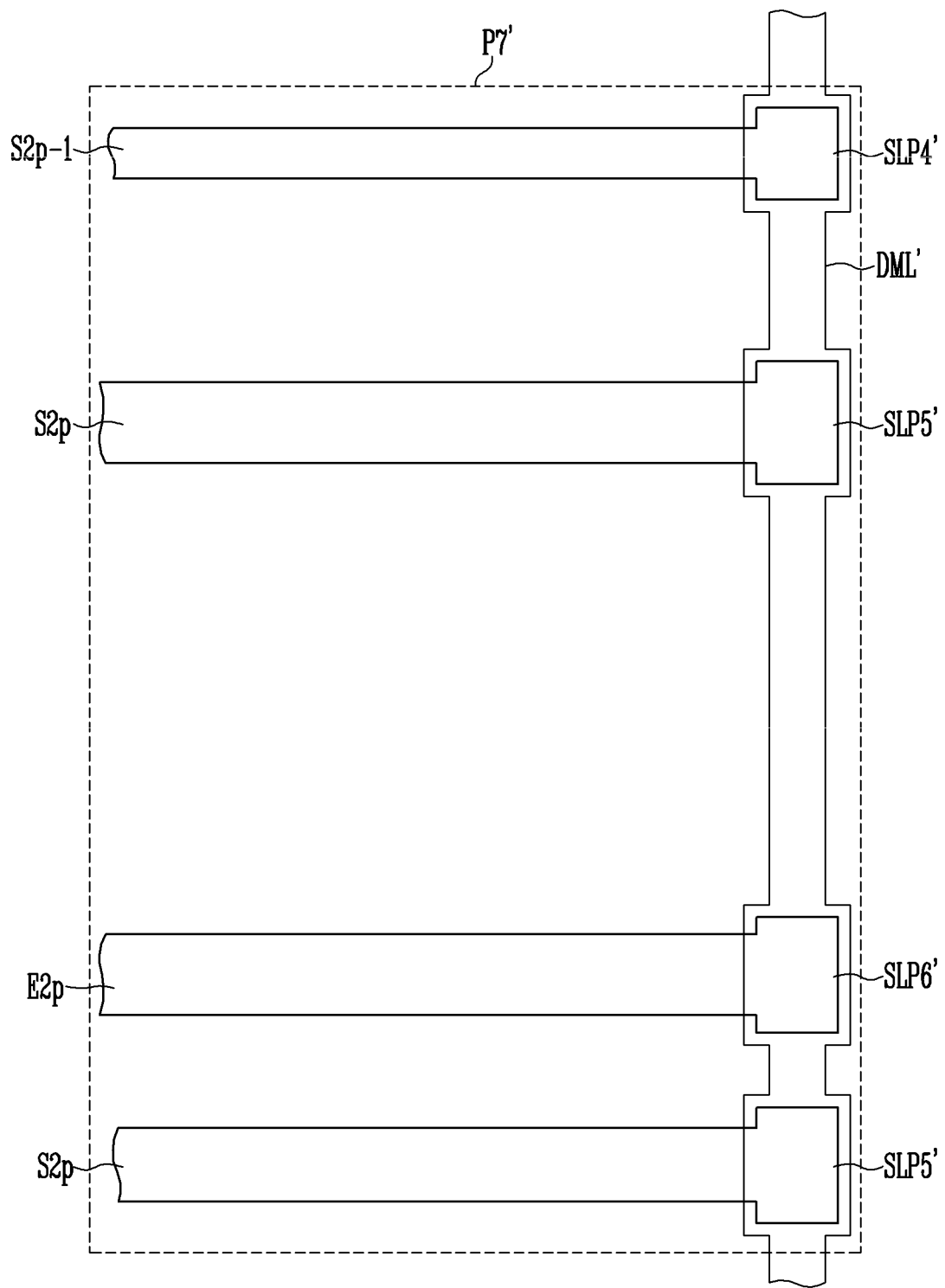
FIG. 32 is a plan view illustrating a portion corresponding to P7' of FIG. 24.

FIGS. 23 and 24 illustrate display devices according to embodiments of the present disclosure, which are plan views illustrating the display devices each having a dummy unit DMP1 and DMP2 disposed in a peripheral region PPA. FIG. 25 is a plan view illustrating a portion corresponding to P4 of FIG. 23. FIG. 26 is a plan view illustrating a portion corresponding to P5 of FIG. 23. FIG. 27 is a plan view illustrating a portion corresponding to P6 of FIG. 23. FIG. 28 is a plan view illustrating a portion corresponding to P7 of FIG. 23. FIG. 29 is a plan view illustrating a portion corresponding to P4' of FIG. 24. FIG. 30 is a plan view illustrating a portion corresponding to P5' of FIG. 24. FIG. 31 is a plan view illustrating a portion corresponding to P6' of FIG. 24. FIG. 32 is a plan view illustrating a portion corresponding to P7' of FIG. 24. For convenience of description, scan lines and light emitting control lines corresponding to one pixel are illustrated in FIGS. 23 to 32.

Referring to FIGS. 23 to 25, in order to compensate for a difference in load value for each pixel region, a dummy unit DMP1, DMP2, DMP1' or DMP2' is provided or is not provided to a peripheral region corresponding to each pixel region, so that structures having different parasitic capacitances are employed. That is, in order to compensate for a difference in load value between scan lines in a first pixel region PXA1 and a second pixel region PXA2, the dummy unit DMP1, DMP2, DMP1' or DMP2' is not provided to a first peripheral region PPA1 corresponding to the first pixel region PXA1, and the dummy unit DMP1 may be provided in a second peripheral region PPA2 corresponding to the second pixel region PXA2 and an additional peripheral region APA.

In an embodiment, end portions of first scan lines S1$i$–1 and S1$i$ and a first light emitting control line E1$i$ may be provided in the first peripheral region PPA1, and end portions of second scan lines S2$i$–1, S2$i$, S2$p$–1, S2$p$, S2$k$–1, and S2$k$ (k being a natural number different from i and p) and second light emitting control lines E2$i$, E2$p$, and E2$k$ may be provided to the second peripheral region PPA2 or the additional peripheral region APA. The dummy unit DMP1 or DMP1' is not provided to the end portions of the first scan lines S1$i$–1 and S1$i$ and the first light emitting control line E1$i$, and may be provided to a region corresponding to the end portions of the second scan lines S2$i$–1, S2$i$, S2$p$–1, S2$p$, S2$k$–1, and S2$k$ and the second light emitting control lines E2$i$, E2$p$, and E2$k$.

The dummy unit DMP1 or DMP1' may include a plurality of sub-dummy units DMP11 or DMP11', DMP12 or DMP12', and DMP13 or DMP13'. For example, the dummy unit DMP1 or DMP1' may include a first sub-dummy unit DMP11 or DMP11', a second sub-dummy unit DMP12 or DMP12', and a third sub-dummy units DMP13 or DMP13'. The first sub-dummy unit DMP11 or DMP11' may compensate for load values of one of a first sub-region SA1, a second sub-region SA2, and a third sub-region SA3 of the second pixel region PXA2, for example, the second scan lines S2$i$–1 and S2$i$ and the second light emitting control line E2$i$ of the first sub-region SA1. The second sub-dummy unit DMP12 or DMP12' may compensate for load values of another of the first sub-region SA1, the second sub-region SA2, and the third sub-region SA3 of the second pixel region PXA2, for example, the second scan lines S2$p$–1 and S2$p$ and the second light emitting control line E2$p$ of the second sub-region SA2. The third sub-dummy units DMP13 or DMP13' may compensate for load values of the other of the first sub-region SA1, the second sub-region SA2, and the third sub-region SA3 of the second pixel region PXA2, for example, the second scan lines S2$k$–1 and S2$k$ and the second light emitting control line E2$k$ of the third sub-region SA3.

The first sub-dummy unit DMP11 or DMP11', the second sub-dummy unit DMP12 or DMP12', and the third sub-dummy unit DMP13 or DMP13' may be disposed to be spaced apart from one another. For example, the first sub-dummy unit DMP11 or DMP11' may be disposed at a portion of the additional peripheral region APA adjacent to the first sub-region SA1. The second sub-dummy unit DMP12 or DMP12' may be disposed at a portion of the second peripheral region PPA2 adjacent to the second sub-region SA2, for example, a lateral part of the second peripheral region PPA2. The third sub-dummy unit DMP13 or DMP13' may be disposed at a portion of the second peripheral region PPA2 adjacent to the third sub-region SA3, for example, a longitudinal part of the second peripheral region PPA2. Because the first sub-dummy unit DMP11 or DMP11', the second sub-dummy unit DMP12 or DMP12', and the third sub-dummy unit DMP13 or DMP13' are disposed to be spaced apart from one another, the width of the second peripheral region PPA2 can be decreased.

The dummy unit DMP1 or DMP1' may overlap with the second scan lines S2$i$–1, S2$i$, S2$p$–1, S2$p$, S2$k$–1, and S2$k$ and the second light emitting control lines E2$i$, E2$p$, and E2$k$. For example, the first sub-dummy unit DMP11 or DMP11' and the second sub-dummy unit DMP12 or DMP12' may include a dummy line DML or DML' overlapping with the end portions of the second scan lines S2$i$–1, S2$i$, S2$p$–1, S2$p$, S2$k$–1, and S2$k$ and the second light emitting control lines E2$i$, E2$p$, and E2$k$. That is, the dummy line DML or DML' may be provided to the second peripheral region PPA2 and the additional peripheral region APA. In addition, a fixed voltage may be applied to the dummy line DML or DML'. Therefore, the dummy line DML or DML' may overlap with the second scan lines S2$i$–1, S2$i$, S2$p$–1, S2$p$, S2$k$–1, and S2$k$ and the second light emitting control lines E2$i$, E2$p$, and E2$k$, thereby forming a parasitic capacitor.

The dummy line DML or DML' overlaps with the second scan lines S2$i$–1, S2$i$, S2$p$–1, S2$p$, S2$k$–1, and S2$k$ and the second light emitting control lines E2$i$, E2$p$, and E2$k$, thereby forming a parasitic capacitor, and the forming position or material of the dummy line DML or DML' is not particularly limited. In an embodiment, the dummy line DML or DML' may be formed of the same or substantially the same material as a power line using the same process. Therefore, the dummy line DML or DML' may be formed in the same layer as the power line, and may include the same or substantially the same material as the power line. The dummy line DML or DML' overlaps with the second scan lines S2$i$–1, S2$i$, S2$p$–1, S2$p$, S2$k$–1, and S2$k$ and the second light emitting control lines E2$i$, E2$p$, and E2$k$, so that a parasitic capacitor may be formed between the dummy line DML or DML' and the second scan lines S2$i$–1, S2$i$, S2$p$–1, S2*p*, S2*k*−1, and S2*k* and between the dummy line DML or DML' and the second light emitting control lines E2*i*, E2*p*, and E2*k*.

The parasitic capacitance of the parasitic capacitor may be changed depending on overlapping areas of the dummy line DML or DML' with the second scan lines S2*i*−1, S2*i*, S2*p*−1, S2*p*, S2*k*−1, and S2*k* and the second light emitting control lines E2*i*, E2*p*, and E2*k*. Therefore, in order to increase the parasitic capacitance, an (i−1)th second scan line pad SLP1 or SLP1', an ith second scan line pad SLP2 or SLP2', an ith second light emitting control line pad SLP3 or SLP3', a (p−1)th (p≠i) second scan line pad SLP4 or SLP4', a pth second scan line pad SLP5 or SLP5', a pth second light emitting control line pad SLP6 or SLP6', a (k−1)th (k≠i and k≠p) second scan line pad SLP7 or SLP7', a kth second scan line pad SLP8 or SLP8', and a kth second light emitting control line pad SLP9 or SLP9' may be provided to the respective end portions of the second scan lines S2*i*−1, S2*i*, S2*p*−1, S2*p*, S2*k*−1, and S2*k* and the second light emitting control lines E2*i*, E2*p*, and E2*k*.

The (i−1)th second scan line pad SLP1 or SLP1', the ith second scan line pad SLP2 or SLP2', and the ith second light emitting control line pad SLP3 or SLP3' have greater widths than the (i−1)th second scan line S2*i*−1, the ith second scan line S2*i*, and the ith light emitting control line E2*i*, respectively, and accordingly, the overlapping area with the dummy line DML or DML' can be increased.

The (p−1)th second scan line pad SLP4 or SLP4', the pth second scan line pad SLP5 or SLP5', and the pth second light emitting control line pad SLP6 or SLP6' have greater widths than the (p−1)th second scan line S2*p*−1, the pth second scan line S2*p*, and the pth second light emitting control line E2*p*, respectively, and accordingly, the overlapping area with the dummy line DML or DML' can be increased.

The (k−1)th second scan line pad SLP7 or SLP7', the kth second scan line pad SLP8 or SLP8', and the kth second light emitting control line pad SLP9 or SLP9' have greater widths than the (k−1)th second scan line S2*k*−1, the kth second scan line S2*k*, and the kth second light emitting control line E2*k*, respectively, and accordingly, the overlapping area with the dummy line DML or DML' can be increased.

Here, the dummy line DML or DML' may also be widely formed to cover the (i−1)th second scan line pad SLP1 or SLP1', the ith second scan line pad SLP2 or SLP2', the ith second light emitting control line pad SLP3 or SLP3', the (p−1)th second scan line pad SLP4 or SLP4', the pth second scan line pad SLP5 or SLP5', the pth second light emitting control line pad SLP6 or SLP6', the (k−1)th second scan line pad SLP7 or SLP7', the kth second scan line pad SLP8 or SLP8', and the kth second light emitting control line pad SLP9 or SLP9'.

Accordingly, a load caused by a parasitic capacitor additionally generated by the dummy unit DMP provided to the second peripheral region PPA2 is increased in the second scan lines S2*i*−1, S2*i*, S2*p*−1, S2*p*, S2*k*−1, and S2*k* and the second light emitting control lines E2*i*, E2*p*, and E2*k*, and the load value of the second scan lines S2*i*−1, S2*i*, S2*p*−1, S2*p*, S2*k*−1, and S2*k* and the second light emitting control lines E2*i*, E2*p*, and E2*k* of the second pixel region PXA2 is compensated. As a result, the load value of the second scan lines S2*i*−1, S2*i*, S2*p*−1, S2*p*, S2*k*−1, and S2*k* and the second light emitting control lines E2*i*, E2*p*, and E2*k* may be equal or similar to that of the first scan lines S1*i*−1 and S1*i* and the second light emitting control line E1*i*.

In an embodiment, when the lengths of the second scan lines and the second light emitting control lines of the second pixel region PXA2 are all the same, the load values compensated by the dummy unit DMP1 and DMP1' may be the same. That is, as shown in FIGS. 23 and 26 to 28, the parasitic capacitances of parasitic capacitors formed in the first sub-dummy unit DMP11 or DMP11', the second sub-dummy unit DMP12 or DMP12', and the third sub-dummy unit DMP13 or DMP13' may be the same.

In addition, when the lengths of the second scan lines and the second light emitting control lines of the second pixel region PXA2 are different from each other, the load values compensated by the dummy unit DMP1 and DMP1' may be different from each other. That is, as shown in FIGS. 24 and 29 to 32, the parasitic capacitances of parasitic capacitors formed in the first sub-dummy unit DMP11 or DMP11', the second sub-dummy unit DMP12 or DMP12', and the third sub-dummy unit DMP13 or DMP13' may be different from one another. For example, the parasitic capacitance of the parasitic capacitor formed in the first sub-dummy unit DMP11 or DMP11' may be smallest. In addition, the parasitic capacitance of the parasitic capacitor formed in the third sub-dummy unit DMP13 or DMP13' may be smallest.

In an embodiment, in order to compensate for a difference in load value between the scan lines and the light emitting control lines in the first pixel region PXA1 and scan lines and light emitting control lines in a third pixel region PXA3, any dummy unit is not provided to the first peripheral region PPA1 corresponding to the first pixel region PXA1, and the dummy unit DMP2 or DMP2' may be provided to a third peripheral region PPA3 corresponding to the third pixel region PXA3 and the additional peripheral region APA.

The dummy unit DMP2 or DMP2' may include a fourth sub-dummy unit DMP21 or DMP21', a fifth sub-dummy unit DMP22 or DMP22', and a sixth sub-dummy unit DMP23 or DMP23'. The fourth sub-dummy unit DMP21 or DMP21' may compensate for load values of one of a first sub-region SA1, a second sub-region SA2, and a third sub-region SA3 of the third pixel region PXA3, for example, third scan lines and third light emitting control lines of the first sub-region SA1. The fifth sub-dummy unit DMP22 or DMP22' may compensate for load values of another of the first sub-region SA1, the second sub-region SA2, and the third sub-region SA3, for example, the third scan lines and the third light emitting control lines of the second sub-region SA2. The sixth sub-dummy unit DMP23 or DMP23' may compensate for load values of the other of the first sub-region SA1, the second sub-region SA2, and the third sub-region SA3, for example, the third scan lines and the third light emitting control lines of the third sub-region SA3.

The fourth sub-dummy unit DMP21 or DMP21', the fifth sub-dummy unit DMP22 or DMP22', and the sixth sub-dummy unit DMP23 or DMP23' may be disposed to be spaced apart from one another. For example, the fourth sub-dummy unit DMP21 or DMP21' may be disposed at a portion of the additional peripheral region APA adjacent to the first sub-region SA1, for example, the additional peripheral region APA. The fifth sub-dummy unit DMP22 or DMP22' may be disposed at a portion of the third peripheral region PPA3 adjacent to the second sub-region SA2, for example, a lateral part of the third peripheral region PPA3. The sixth sub-dummy unit DMP23 or DMP23' may be disposed at a portion of the third peripheral region PPA3 adjacent to the third sub-region SA3, for example, a longitudinal part of the third peripheral region PPA3. Because the fourth sub-dummy unit DMP21 or DMP21', the fifth sub-dummy unit DMP22 or DMP22', and the sixth sub-dummy unit DMP23 or DMP23' are disposed to be spaced apart from one another, the width of the third peripheral region PPA3 can be decreased.

In an embodiment, when the lengths of the third scan lines and the third light emitting control lines of the third pixel region PXA3 are all the same, the load values compensated by the fourth sub-dummy unit DMP21 or DMP21', the fifth sub-dummy unit DMP22 or DMP22', and the sixth sub-dummy unit DMP23 or DMP23' may be the same.

In addition, when the lengths of the third scan lines and the third light emitting control lines of the third pixel region PXA3 are different from each other, the load values compensated by the fourth sub-dummy unit DMP21 or DMP21', the fifth sub-dummy unit DMP22 or DMP22', and the sixth sub-dummy unit DMP23 or DMP23' may be different from one another.

According to the present disclosure, the display device has two or more regions having different areas, and luminances in the respective regions can be uniform.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two elements, it can be the only layer between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as set forth in the following claims, and equivalents thereof.

What is claimed is:

1. A display device comprising:
   a substrate having a first pixel region, a second pixel region having a smaller area than the first pixel region, the second pixel region being connected to the first pixel region, and a peripheral region surrounding the first pixel region and the second pixel region;
   a first pixel and a second pixel respectively at the first and second pixel regions;
   a first line connected to the first pixel and a second line connected to the second pixel; and
   a dummy unit in the peripheral region, the dummy unit overlapping with at least one of the first and second lines,
   wherein the dummy unit comprises at least two sub-dummy units spaced from each other.

2. The display device of claim 1, wherein the peripheral region has:
   a first peripheral region around the first pixel region;
   a second peripheral region around the second pixel region; and
   an additional peripheral region adjacent to the first pixel region and the second peripheral region.

3. The display device of claim 2, wherein a length of the first line is greater than that of the second line.

4. The display device of claim 3, wherein the first line is a first scan line for providing a scan signal to the first pixel, and
   wherein the second line is a second scan line for providing a scan signal to the second pixel.

5. The display device of claim 4, wherein the dummy unit comprises:
   a first sub-dummy unit in the additional peripheral region; and
   a second sub-dummy unit in the second peripheral region.

6. The display device of claim 5, wherein the dummy unit comprises a dummy line at the second peripheral region and the additional peripheral region, the dummy line overlapping with the second scan line.

7. The display device of claim 6, wherein a fixed voltage is applied to the dummy line.

8. The display device of claim 7, further comprising a power line for providing the first pixel and the second pixel with power,
wherein the dummy line receives a same voltage as the power line.

9. The display device of claim 6, wherein the second pixel region has:
a first sub-region adjacent to the first pixel region; and
a second sub-region spaced from the first pixel region.

10. The display device of claim 9, wherein a portion of the dummy line of the first sub-dummy unit overlaps with the second scan line connected to the second pixel of the first sub-region, and
wherein a portion of the dummy line of the second sub-dummy unit overlaps with the second scan line connected to the second pixel of the second sub-region.

11. The display device of claim 10, wherein a width of the second sub-region decreases as a distance from the first sub-region increases.

12. The display device of claim 11, wherein a load value compensated by the first sub-dummy unit is different from that compensated by the second sub-dummy unit.

13. The display device of claim 12, wherein the load value compensated by the first sub-dummy unit is smaller than that compensated by the second sub-dummy unit.

14. The display device of claim 11, wherein a width of the second scan line connected to the second pixel of the first sub-region is different from a width of the second scan line connected to the second pixel of the second sub-region, and
wherein an overlapping area between the dummy line and the second scan line in the first sub-region is different from an overlapping area between the dummy line and the second scan line in the second sub-region.

15. The display device of claim 11, wherein the dummy line overlaps with an end portion of the second scan line in the first sub-region and an end portion of the second scan line in the second sub-region.

16. The display device of claim 15, further comprising:
a first scan line pad at the end portion of the second scan line in the first sub-region,
a second scan line pad at the end portion of the second scan line in the second sub-region,
wherein the dummy line covers the first and second scan line pads.

17. The display device of claim 16, wherein an overlapping area between the dummy unit and the first scan line pad is different from an overlapping area between the dummy unit and the second scan line pad.

18. The display device of claim 4, wherein the substrate further has a third pixel region spaced from the second pixel region, the third pixel region being connected to the first pixel region.

19. The display device of claim 18, further comprising:
a third pixel at the third pixel region; and
a third scan line for providing a scan signal to the third pixel,
wherein a length of the third scan line is less than that of the first scan line.

20. The display device of claim 19, further comprising an additional dummy unit overlapping with the third scan line, the additional dummy unit being configured to compensate for a difference between a load value of the third scan line and a load value of the first scan line.

* * * * *